US012701947B2

(12) United States Patent
Miyazaki et al.

(10) Patent No.: US 12,701,947 B2
(45) Date of Patent: Aug. 4, 2026

(54) SUBSTRATE PROCESSING APPARATUS

(71) Applicant: EBARA CORPORATION, Tokyo (JP)

(72) Inventors: Mitsuru Miyazaki, Tokyo (JP);
Hiroshi Sotozaki, Tokyo (JP); Hiroki Miyamoto, Tokyo (JP); Kenichi Takebuchi, Tokyo (JP); Saki Miyagawa, Tokyo (JP); Hiroki Saito, Tokyo (JP); Takuya Inoue, Tokyo (JP); Shozo Takahashi, Tokyo (JP); Ryohei Ishii, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 288 days.

(21) Appl. No.: 18/642,477

(22) Filed: Apr. 22, 2024

(65) Prior Publication Data

US 2024/0363372 A1 Oct. 31, 2024

(30) Foreign Application Priority Data

Apr. 28, 2023 (JP) ................................. 2023-074986
Mar. 12, 2024 (JP) ................................. 2024-037765

(51) Int. Cl.
*H01L 21/67* (2006.01)
*H01L 21/687* (2006.01)
(Continued)

(52) U.S. Cl.
CPC ...... *H10P 72/0414* (2026.01); *H10P 72/0408* (2026.01); *H10P 72/0428* (2026.01); *H10P 72/7602* (2026.01); *H10P 72/0456* (2026.01); *H10P 72/0458* (2026.01); *H10P 72/0472* (2026.01)

(58) Field of Classification Search
CPC ............. H10P 72/0414; H10P 72/7602; H10P 72/0408; H10P 72/0428; H10P 72/0456; H10P 72/0458; H10P 72/0472
See application file for complete search history.

(56) References Cited

U.S. PATENT DOCUMENTS 5,830,045 A 11/1998 Togawa et al.
5,989,105 A * 11/1999 Kawakawaguchi .. H10P 90/128
451/36

(Continued)

FOREIGN PATENT DOCUMENTS

JP H 11330037 A 11/1999
JP 2010-050436 A 3/2010
(Continued)

*Primary Examiner* — Benjamin L Osterhout
(74) *Attorney, Agent, or Firm* — BakerHostetler

(57) ABSTRACT

A substrate processing apparatus that can quickly transport a polished substrate (e.g., a wafer) to a cleaning module is disclosed. A first processing unit includes: a polishing module configured to polish the substrate W; a cleaning module configured to clean the substrate W; a drying module configured to dry the cleaned substrate W; a substrate transporter extending from one side to opposite side of the first processing unit; an elevating transporter configured to transport the substrate from the substrate transporter to the polishing module and from the polishing module to the cleaning module; and a relay transporter configured to transport the substrate. The relay transporter of the first processing unit is configured to transport the substrate between processing units.

21 Claims, 22 Drawing Sheets

(51) Int. Cl.
    *H10P 72/00*       (2026.01)
    *H10P 72/76*       (2026.01)

(56)         References Cited

U.S. PATENT DOCUMENTS

| | | | |
|---|---|---|---|
| 6,358,128 B1 * | 3/2002 | Sakurai | B24B 37/345 |
| | | | 451/287 |
| 6,866,565 B2 * | 3/2005 | Hirokawa | B24D 3/28 |
| | | | 451/28 |
| 2003/0191551 A1 | 10/2003 | Gotoh et al. | |
| 2004/0209550 A1 * | 10/2004 | Jeong | B24B 37/345 |
| | | | 451/41 |
| 2011/0104997 A1 * | 5/2011 | Jeong | B24B 37/10 |
| | | | 451/65 |
| 2017/0287755 A1 * | 10/2017 | Tanaka | H10P 72/0606 |
| 2021/0278768 A1 * | 9/2021 | Sakata | G03F 7/162 |
| 2021/0323117 A1 | 10/2021 | Rangarajan et al. | |
| 2022/0152780 A1 * | 5/2022 | Douki | B24B 49/16 |
| 2022/0344164 A1 * | 10/2022 | Nakamura | B24B 37/005 |

FOREIGN PATENT DOCUMENTS

| | | | |
|---|---|---|---|
| JP | 2016-117137 A | 6/2016 | |
| WO | WO 99-26763 A2 | 6/1999 | |
| WO | WO 2019-151041 A1 | 8/2019 | |
| WO | WO 2022-005025 A1 | 1/2022 | |

* cited by examiner

FIG. 9

U1 : FIRST MAINTENANCE INDEX VALUE
U2 : SECOND MAINTENANCE INDEX VALUE
M1 : MAINTENANCE TIME OF FIRST PROCESSING UNIT
M2 : MAINTENANCE TIME OF SECOND PROCESSING UNIT
S1 : FIRST THRESHOLD VALUE
S2 : SECOND THRESHOLD VALUE

U1 : FIRST MAINTENANCE INDEX VALUE
U2 : SECOND MAINTENANCE INDEX VALUE
M1 : MAINTENANCE TIME OF FIRST PROCESSING UNIT
M2 : MAINTENANCE TIME OF SECOND PROCESSING UNIT
S1 : FIRST THRESHOLD VALUE
S2 : SECOND THRESHOLD VALUE

U1 : FIRST MAINTENANCE INDEX VALUE
U2 : SECOND MAINTENANCE INDEX VALUE
M1 : MAINTENANCE TIME OF FIRST PROCESSING UNIT
M2 : MAINTENANCE TIME OF SECOND PROCESSING UNIT
S1 : FIRST THRESHOLD VALUE
S2 : SECOND THRESHOLD VALUE

U1 : FIRST MAINTENANCE INDEX VALUE
U2 : SECOND MAINTENANCE INDEX VALUE
M1 : MAINTENANCE TIME OF FIRST PROCESSING UNIT
M2 : MAINTENANCE TIME OF SECOND PROCESSING UNIT
S1 : FIRST THRESHOLD VALUE
S2 : SECOND THRESHOLD VALUE

U1 : FIRST MAINTENANCE INDEX VALUE
U2 : SECOND MAINTENANCE INDEX VALUE
M1 : MAINTENANCE TIME OF FIRST PROCESSING UNIT
M2 : MAINTENANCE TIME OF SECOND PROCESSING UNIT
S1 : FIRST THRESHOLD VALUE
S2 : SECOND THRESHOLD VALUE

SUBSTRATE PROCESSING APPARATUS

CROSS REFERENCE TO RELATED APPLICATION

This document claims priorities to Japanese Patent Application No. 2023-074986 filed Apr. 28, 2023, and Japanese Patent Application No. 2024-037765 filed Mar. 12, 2024, the entire contents of which are hereby incorporated by reference.

BACKGROUND

In manufacturing of semiconductor devices, many types of materials are repeatedly formed into films on a wafer to form a multilayered structure. In order to form the multilayered structure, it is important to planarize a surface of the wafer. A polishing apparatus that performs chemical mechanical polishing (CMP) is used as a technique of planarizing the surface of the wafer.

The polishing apparatus generally includes a polishing table on which a polishing pad is attached, a polishing head for pressing a wafer against the polishing pad on the polishing table, and a nozzle for supplying a polishing liquid onto the polishing pad. While the polishing liquid is supplied onto the polishing pad from the nozzle, the polishing head presses the wafer against the polishing pad. The polishing head and the polishing pad are moved relative to each other, thereby polishing the wafer.

A substrate processing apparatus has a polishing module for performing the above-mentioned chemical mechanical polishing (CMP), a cleaning module for cleaning a polished wafer, and a drying module for drying a cleaned wafer. The wafer polished by the polishing module is transported by a transfer robot to the cleaning module and the drying module, so that the wafer is cleaned and dried by the cleaning module and the drying module.

In order to polish a wafer in multiple stages or simultaneously polish a plurality of wafers, it is necessary to provide a plurality of polishing modules. However, when many polishing modules are installed, a certain polishing module is located at a longer distance from the cleaning module than other polishing module, and therefore it may take a longer time to transport a polished wafer to the cleaning module. As a result, metal exposed on the surface of the polished wafer may be corroded by the polishing liquid.

SUMMARY

Therefore, there is provided a substrate processing apparatus that can quickly transport a polished substrate (e.g., a wafer) to a cleaning module.

Embodiments, which will be described below, relate to a substrate processing apparatus for processing a substrate, such as wafer, circular substrate, quadrangular substrate, or panel, used for semiconductor devices, and more particularly relates to a substrate processing apparatus including a plurality of polishing modules.

In an embodiment, there is provided a substrate processing apparatus comprising: a first processing unit and a second processing unit each configured to process a substrate, each of the first processing unit and the second processing unit including: a polishing module configured to polish the substrate; a cleaning module configured to clean the substrate; a drying module configured to dry the cleaned substrate; a substrate transporter extending from one side to opposite side of each processing unit; an elevating transporter configured to transport the substrate from the substrate transporter to the polishing module and from the polishing module to the cleaning module; and a relay transporter configured to transport the substrate, the relay transporter of the first processing unit being configured to transport the substrate between the first processing unit and the second processing unit.

In an embodiment, the polishing module and the cleaning module are partitioned by an elevating transportation area in which the elevating transporter is disposed.

In an embodiment, the relay transporter of the first processing unit is arranged between the first processing unit and the second processing unit.

In an embodiment, the substrate transporter includes a substrate stage configured to be stopped at a first position, a second position, and a third position, and the third position is located between the first position and the second position, and the elevating transporter is configured to be able to access the substrate stage at the third position.

In an embodiment, the second position of the substrate transporter of the first processing unit is adjacent to the first position of the substrate transporter of the second processing unit, and the relay transporter of the first processing unit is configured to be able to access both the second position of the substrate transporter of the first processing unit and the first position of the substrate transporter of the second processing unit.

In an embodiment, the elevating transporter and the relay transporter of the first processing unit, and the elevating transporter and the relay transporter of the second processing unit are arranged alternately at equal intervals.

In an embodiment, each of the first processing unit and the second processing unit includes a plurality of polishing modules, and the plurality of polishing modules of the first processing unit and the plurality of polishing modules of the second processing unit are arranged at equal intervals.

In an embodiment, arrangement intervals of the elevating transporter and the relay transporter of the first processing unit and the elevating transporter and the relay transporter of the second processing unit are the same as arrangement intervals of the plurality of polishing modules of the first processing unit and the plurality of polishing modules of the second processing unit.

In an embodiment, the elevating transporter is configured to transport the substrate to the cleaning unit before transporting the substrate to the polishing module.

In an embodiment, the relay transporter is configured to transport the substrate from the cleaning module to the drying module.

In an embodiment, the relay transporter of the first processing unit is configured to be able to access both the polishing module of the first processing unit and the polishing module of the second processing unit.

In an embodiment, a distance from the relay transporter of the first processing unit to the polishing module of the first processing unit is the same as a distance from the relay transporter of the first processing unit to the polishing module of the second processing unit.

In an embodiment, the relay transporter of the first processing unit is configured to be able to access both the cleaning module of the first processing unit and the cleaning module of the second processing unit.

In an embodiment, a distance from the relay transporter of the first processing unit to the cleaning module of the first processing unit is the same as a distance from the relay transporter of the first processing unit to the cleaning module of the second processing unit.

In an embodiment, the substrate processing apparatus further comprises an operation controller configured to control operations of the first processing unit and the second processing unit, the operation controller being configured to: calculate a first maintenance index value related to maintenance of a consumable in the first processing unit and a second maintenance index value related to maintenance of a consumable in the second processing unit; predict a maintenance time of the first processing unit and a maintenance time of the second processing unit based on the first maintenance index value and the second maintenance index value; and when the predicted maintenance time of the first processing unit overlaps with the predicted maintenance time of the second processing unit, change an operating rate of at least one of the first processing unit and the second processing unit such that the predicted maintenance time of the first processing unit does not overlap with the predicted maintenance time of the second processing unit.

In an embodiment, the operation controller is configured to increase the operating rate of the first processing unit, or lower the operating rate of the second processing unit, or increase the operating rate of the first processing unit and lower the operating rate of the second processing unit when the maintenance time of the first processing unit is expected to be reached before the maintenance time of the second processing unit.

In an embodiment, the operation controller is configured to increase the operating rate of the second processing unit, or lower the operating rate of the first processing unit, or increase the operating rate of the second processing unit and lower the operating rate of the first processing unit when the maintenance time of the second processing unit is expected to be reached before the maintenance time of the first processing unit.

In an embodiment, there is provided a substrate processing apparatus comprising: a first processing unit, a second processing unit, and a third processing unit each configured to process a substrate, each of the first processing unit, the second processing unit, and the third processing unit including: a plurality of polishing modules each configured to polish the substrate; a cleaning module configured to clean the substrate; a drying module configured to dry the cleaned substrate; a substrate transporter extending from one side to opposite side of each processing unit; an elevating transporter configured to transport the substrate from the substrate transporter to one of the plurality of polishing modules and from the one of the plurality of polishing modules to the cleaning module; and a relay transporter configured to transport the substrate, the relay transporter of the first processing unit being configured to transport the substrate between the first processing unit and the second processing unit, the relay transporter of the second processing unit being configured to transport the substrate between the second processing unit and the third processing unit.

In an embodiment, the plurality of polishing modules of the first processing unit, the plurality of polishing modules of the second processing unit, and the plurality of polishing modules of the third processing unit are configured to perform three-stage polishing of a plurality of substrates in parallel.

In an embodiment, the substrate processing apparatus further comprises an operation controller configured to control operations of the first processing unit, the second processing unit, and the third processing unit, the operation controller being configured to: calculate a first maintenance index value related to maintenance of a consumable in the first processing unit, a second maintenance index value related to maintenance of a consumable in the second processing unit, and a third maintenance index value related to maintenance of a consumable in the third processing unit; predict a maintenance time of the first processing unit, a maintenance time of the second processing unit, and a maintenance time of the third processing unit based on the first maintenance index value, the second maintenance index value, and the third maintenance index value; and when predicted maintenance times of any two of the first processing unit, the second processing unit, and the third processing unit overlap, change an operating rate of at least one of the two processing units such that the predicted maintenance times of the two processing units do not overlap.

In an embodiment, the operation controller is configured to increase the operating rate of one of the two processing units, or lower the operating rate of other of the two processing units, or increase the operating rate of the one of the two processing units and lower the operating rate of the other of the two processing units when the maintenance time of the one of the two processing units is expected to be reached before the maintenance time of the other of the two processing units.

According to the above-described embodiments, each of the first processing unit and the second processing unit includes the polishing module, the cleaning module, and the elevating transporter, so that polishing and cleaning of a substrate can be completed within each processing unit.

BRIEF DESCRIPTION OF THE DRAWINGS

FIG. 9 is a side view showing still another embodiment of the substrate transporter;

DESCRIPTION OF EMBODIMENTS

Figure 1:
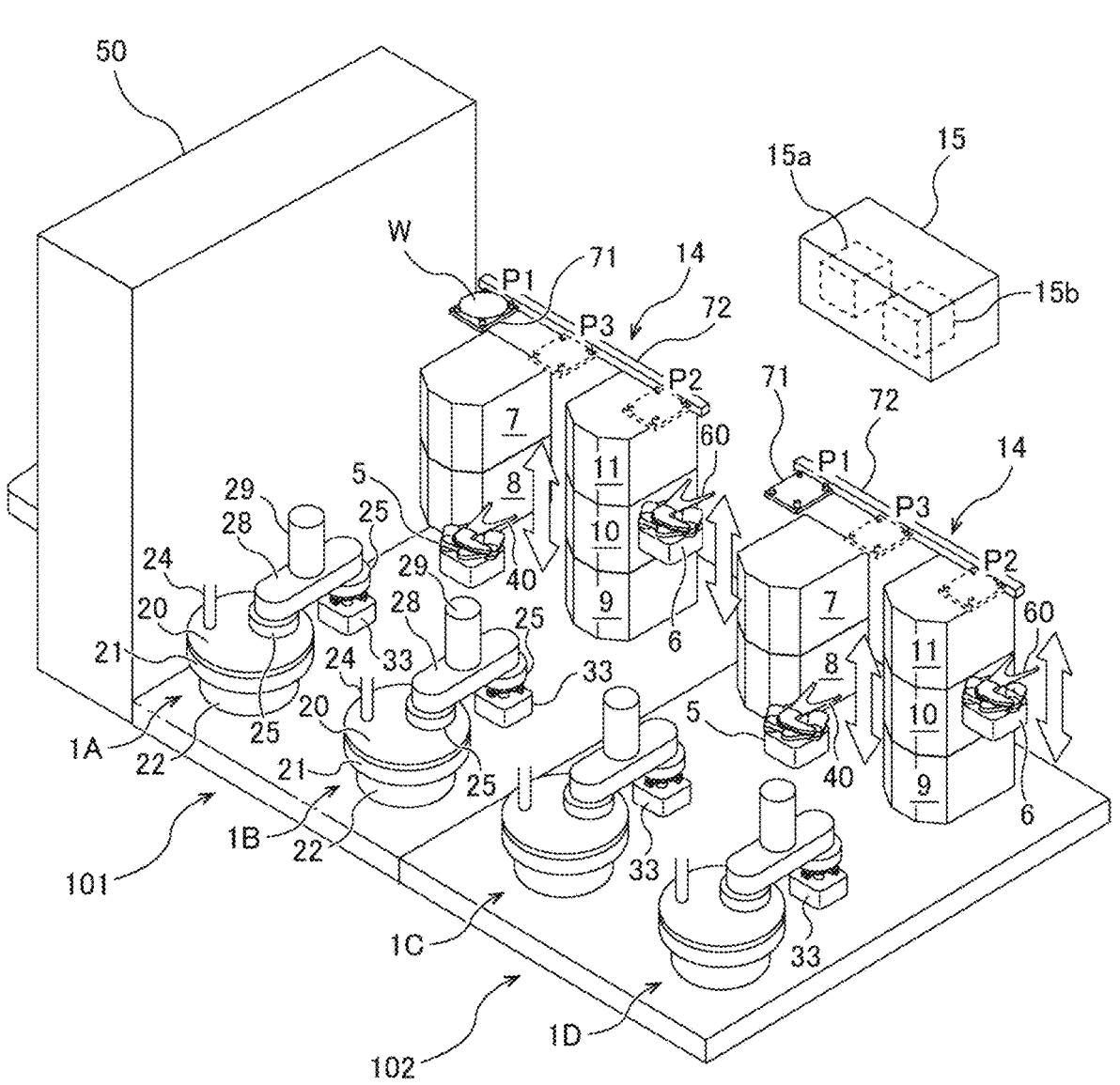
FIG. 1 is a perspective view showing an embodiment of a substrate processing apparatus.
Figure 2:
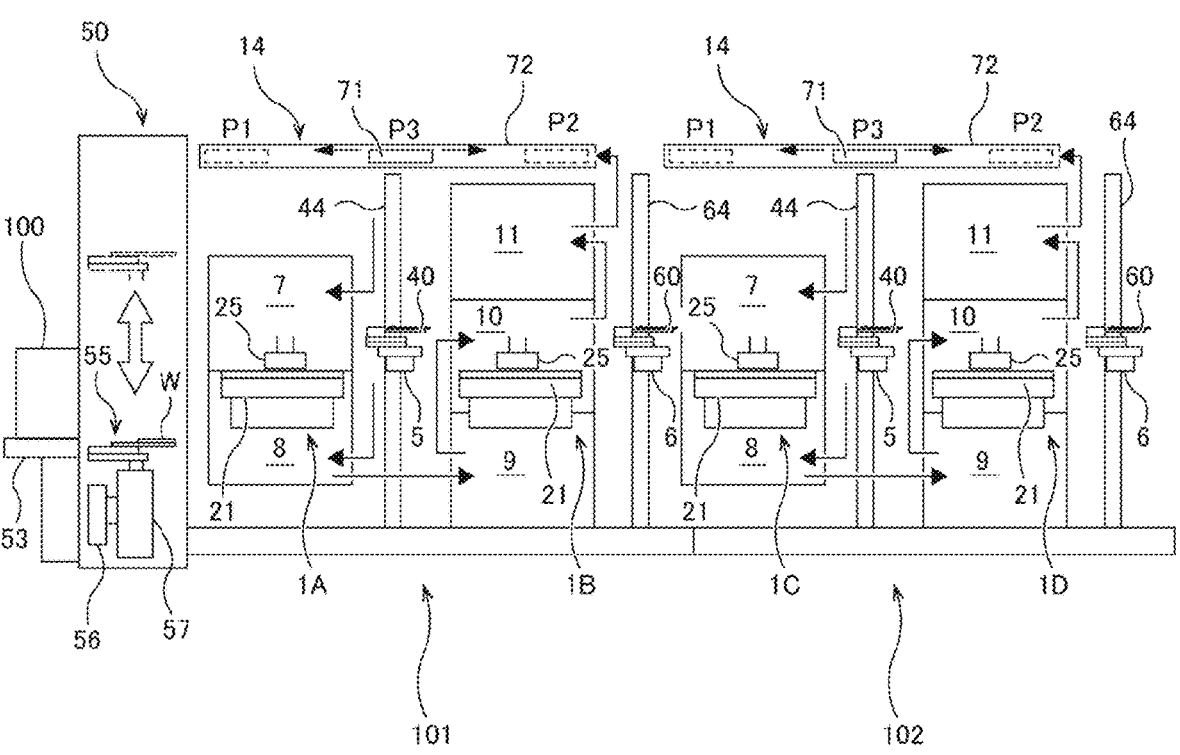
FIG. 2 is a side view of the substrate processing apparatus shown in FIG. 1.
Figure 3:
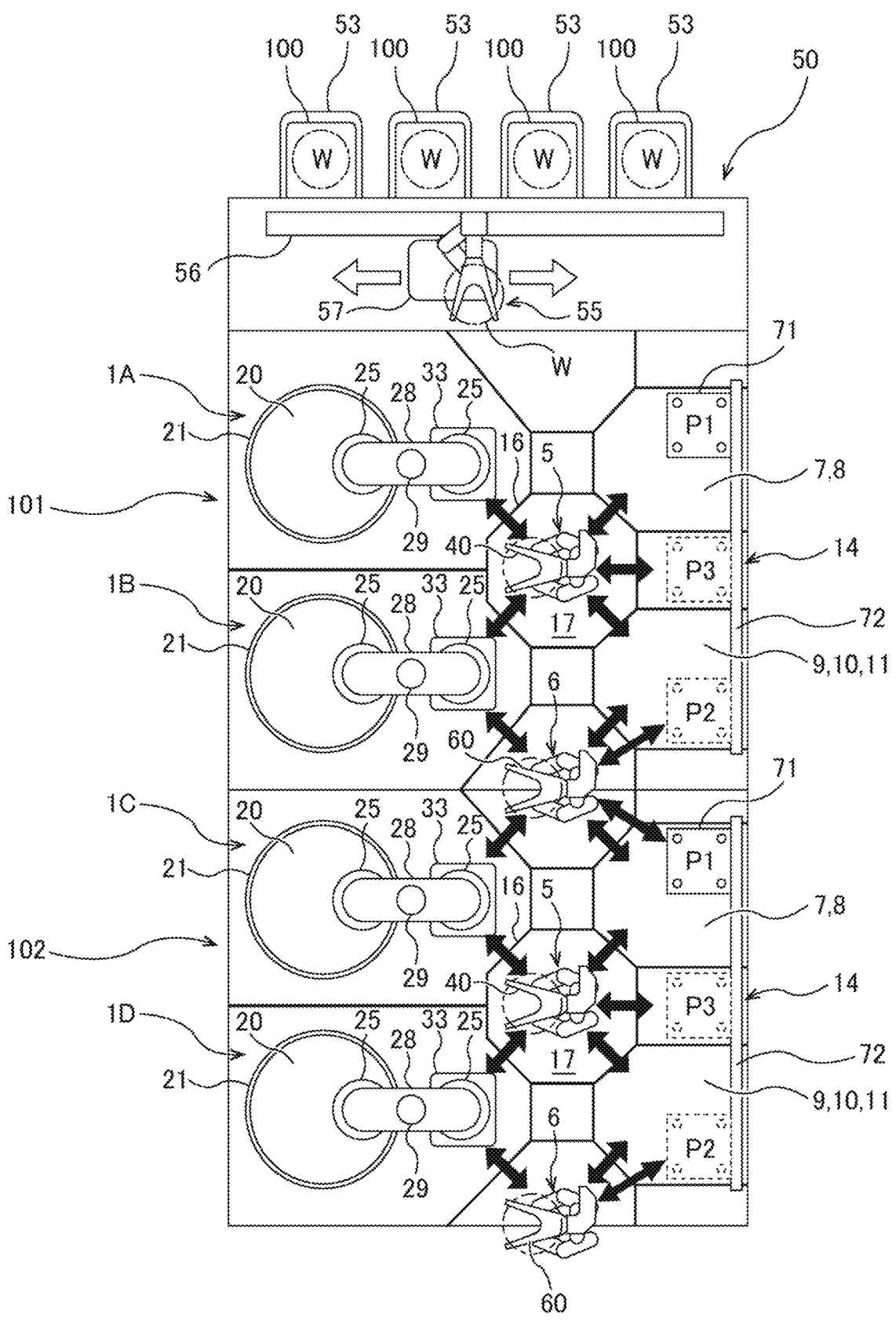
FIG. 3 is a plan view of the substrate processing apparatus shown in FIG. 1.

Hereinafter, embodiments will be described with reference to the drawings. FIG. 1 is a perspective view showing an embodiment of a substrate processing apparatus, FIG. 2 is a side view of the substrate processing apparatus shown in FIG. 1, and FIG. 3 is a plan view of the substrate processing apparatus shown in FIG. 1. The substrate processing apparatus includes a first processing unit 101 and a second processing unit 102 each configured to process a substrate W. Processing of the substrate W includes polishing, cleaning, and drying of the substrate W. The first processing unit 101 and the second processing unit 102 are arranged side by side. Specific examples of the substrate W include wafer, circular substrate, quadrangular substrate, panel, etc. used for semiconductor devices. In the embodiments described below, a circular wafer is used as the substrate W.

Since the first processing unit 101 and the second processing unit 102 have the same components, the first processing unit 101 will be described below. The following description is also applicable to the second processing unit 102. The first processing unit 101 includes a plurality of polishing modules 1A and 1B each configured to polish the substrate W, a plurality of cleaning modules 7, 8, 9, and 10 each configured to clean the substrate W, a drying module 11 configured to dry the cleaned substrate W, a substrate transporter 14 extending from one side to an opposite side of the first processing unit 101, and an elevating transporter 5 configured to transport the substrate W from the substrate transporter 14 to each polishing module 1A, 1B and transport the substrate W from each polishing module 1A, 1B to the plurality of cleaning modules 7, 8, and 9. The elevating transporter 5 is configured to transport the substrate W between the cleaning modules 7, 8, 9, and 10.

The first processing unit 101 further includes a relay transporter 6 configured to transport the substrate W from the cleaning module 10 to the drying module 11 and from the drying module 11 to the substrate transporter 14. The relay transporter 6 of the first processing unit 101 is configured to transport the substrate W between the first processing unit 101 and the second processing unit 102. The substrate processing apparatus includes an operation controller 15 configured to control operations of the above-mentioned elements of the first processing unit 101 and the second processing unit 102. As shown in FIG. 3, the polishing modules 1A, 1B, the elevating transporter 5, the relay transporter 6, the cleaning modules 7, 8, 9, 10, and the drying module 11 are surrounded by a wall (housing) 16, so that cleanliness is controlled to prevent atmosphere inside the wall 16 from spreading to other areas. The substrate W is transported through an opening (including a shutter) provided in the wall (housing) 16. In particular, the polishing modules 1A, 1B are separated from the cleaning modules 7, 8, 9, 10 by an elevating transportation area 17 having the elevating transporter 5 therein. The elevating transportation area 17 is formed by a wall (casing) 16. In FIGS. 1 and 2, detailed illustration of the wall (casing) 16 is omitted.

Each of the first processing unit 101 and the second processing unit 102 is a unitized assembly. In one embodiment, the second processing unit 102 is removably coupled to the first processing unit 101 such that the entirety of the second processing unit 102 is separable from the first processing unit 101. Furthermore, it is possible to couple one or more additional processing units with a similar configuration to the second processing unit 102. Specifically, three or more processing units including the first processing unit 101 and the second processing unit 102 may be coupled in series.

The operations of the plurality of processing units including the first processing unit 101 and the second processing unit 102 are controlled by the operation controller 15. The operation controller 15 includes a memory 15a that stores programs therein, and an arithmetic device 15b configured to execute arithmetic operations according to instructions included in the programs. The operation controller 15 is composed of at least one computer. The memory 15a includes a main memory, such as a random access memory (RAM), and an auxiliary memory, such as a hard disk drive (HDD) or a solid state drive (SSD). Examples of the arithmetic device 15b include a CPU (central processing unit) and a GPU (graphic processing unit). However, the specific configuration of the operation controller 15 is not limited to these examples.

In the embodiment shown in FIGS. 1 to 3, the first processing unit 101 includes two polishing modules 1A and 1B arranged in parallel at the same level (or height). In one embodiment, each of the processing units 101, 102 may include a single polishing module. In another embodiment, each of the processing units 101, 102 may include three or more polishing modules. The substrate transporter 14 is arranged at a higher position than the polishing modules 1A, 1B, the cleaning modules 7, 8, 9, 10, and the drying module 11. In this embodiment, the substrate transporter 14 is arranged above the cleaning modules 7, 8, 9, and 10 and the drying module 11.

The elevating transporter 5 includes a holding hand 40 configured to be accessible to the substrate transporter 14, the polishing modules 1A, 1B, and the cleaning modules 7, 8, 9, and 10. The holding hand 40 is configured to be movable up and down as indicated by arrow in FIG. 1. The relay transporter 6 of the first processing unit 101 includes a holding hand 60 configured to be accessible to the polishing module 1B, the cleaning module 10, the drying module 11, and the substrate transporter 14 of the first processing unit 101, and the substrate transporter 14, the polishing module 1C, and the cleaning modules 7 and 8 of the second processing unit 102. The holding hand 60 is configured to be movable up and down as indicated by arrow in FIG. 1.

The substrate W to be polished is transported by the substrate transporter 14 of the first processing unit 101 with its surface to be polished facing upward. The elevating transporter 5 of the first processing unit 101 ascends to the substrate transporter 14 and removes the substrate W from the substrate transporter 14. Furthermore, the elevating transporter 5 inverts the substrate W such that the surface to be polished of the substrate W faces downward, and then transports the substrate to one of the polishing modules 1A and 1B. The substrate W is polished by one or both of the polishing module 1A and the polishing module 1B. The substrate W is transported between the polishing modules 1A and 1B by the elevating transporter 5.

Since the two polishing modules 1A and B have the same components, the polishing module 1A will be described below. Although a detailed description will be omitted, the polishing modules 1C and 1D of the second processing unit 102 also have the same components.

The polishing module 1A includes a polishing table 21 configured to support a polishing pad 20, a table motor 22 configured to rotate the polishing table 21, a polishing-liquid supply nozzle 24 configured to supply a polishing liquid onto the polishing pad 20, two polishing heads 25, 25 each configured to press a substrate W against the polishing pad 20 to polish the substrate W, and polishing-head motors (not shown) configured to rotate the polishing heads 25, 25 about their axes, respectively. The two polishing heads 25, 25 are rotatably supported by a head arm 28. The polishing-head motors are disposed in the head arm 28. A central portion of the head arm 28 is supported by a support shaft 29.

The polishing module 1A further includes a substrate loader 33 configured to receive the substrate W from the elevating transporter 5 and deliver the substrate W to one of the two polishing heads 25, 25. The substrate loader 33 is arranged outside the polishing table 21. The elevating transporter 5 is configured to invert the substrate W such that the surface to be polished of the substrate W faces downward, and transport the substrate W to the substrate loader 33 with the surface to be polished of the substrate W facing downward.

The polishing module 1A further includes an arm rotation motor (not shown) configured to rotate the head arm 28 and the two polishing heads 25, 25 about the support shaft 29. This arm rotation motor is installed on the head arm 28 or the support shaft 29. When the head arm 28 is rotated by an angle of 180 degrees by the arm rotation motor, one of the two polishing heads 25, 25 is moved to a position above the polishing pad 20, and the other polishing head 25 is moved to a position above the substrate loader 33. The substrate loader 33 is configured to lift the substrate W and deliver the substrate W to the polishing head 25 located outside the polishing table 21. The polishing heads 25, 25 are configured to be able to hold the substrate W on their lower surfaces by vacuum suction. In one embodiment, one or both of polishing modules 1A, 1B may have a single polishing head 25.

The polishing of the substrate W is performed as follows. When the substrate W to be polished is held by the polishing head 25, the head arm 28 rotates 180 degrees, so that the polishing head 25 moves together with the substrate W to the position above the polishing pad 20. The polishing table 21 and the polishing pad 20 are rotated by the table motor 22, and the polishing liquid (typically slurry) is supplied onto the polishing pad 20 from the polishing-liquid supply nozzle 24. The polishing head 25 presses a lower surface (surface to be polished) of the substrate W against the polishing pad 20 while the polishing head 25 is rotated by the polishing-head motor (not shown) disposed in the head arm 28. The lower surface of the substrate W is polished by a combination of a chemical action of the polishing liquid and a mechanical action of the abrasive grains contained in the polishing liquid and/or the polishing pad 20. The polishing modules 1A and 1B of this embodiment are chemical mechanical polishing apparatuses (CMP apparatuses) that chemically mechanically polish the substrate W.

When the polishing of the substrate W is terminated, the head arm 28 rotates 180 degrees, so that the polishing head 25 moves to the position above the substrate loader 33 together with the polished substrate W. The polishing head 25 releases the substrate W, and the substrate W is placed on the substrate loader 33. The holding hand 40 of the elevating transporter 5 removes the substrate W from the substrate loader 33 and transports the substrate W into one of the plurality of cleaning modules 7 to 10. In this embodiment, since the polishing module 1A has two polishing heads 25, 25, while one polishing head 25 is located above the polishing pad 20 or polishing the substrate W, the other polishing head 25 can release the substrate W and can hold a substrate to be polished next.

The plurality of cleaning modules 7, 8, 9, 10 of this embodiment include the cleaning module 7 used as a pre-cleaning module or a post-cleaning module, and the plurality of (three in FIG. 1) cleaning modules 8, 9, 10 used as post-cleaning modules. The pre-cleaning module is a cleaning device for cleaning the substrate W before being polished by the polishing modules 1A, 1B. The post-cleaning module is a cleaning device for cleaning the substrate W after being polished by the polishing modules 1A, 1B. The cleaning module 7 and the cleaning module 8 are arranged along a vertical direction, and the cleaning module 9, the cleaning module 10, and the drying module 11 are also arranged along a vertical direction. A group of the cleaning modules 7, 8 is arranged apart from a group of the cleaning modules 9, 10 and the drying module 11. The cleaning module 7 is arranged above the cleaning module 8. The drying module 11 is arranged above the cleaning module 10, and the cleaning module 10 is arranged above the cleaning module 9.

The types of the four cleaning modules 7, 8, 9, and 10 are not particularly limited. In one example, the cleaning module 7 is a buff cleaning device or a sponge scrubbing device, the cleaning modules 8, 9 are sponge scrubbing devices, and the cleaning module 10 is a two-fluid jet cleaning device. The cleaning mechanism of the cleaning modules 7, 8, 9, and 10 can use a known configuration. The type of drying module 11 is also not particularly limited. For example, the drying module 11 may be an IPA drying device that dries the substrate W by spraying isopropyl alcohol vapor onto the substrate W, or may also be a spin drying device that removes liquid from the substrate W by rotating the substrate W at high speed.

The operation of the elevating transporter 5 can be switched between a pre-cleaning mode in which the substrate W is transported to the cleaning module 7 before being transported to the polishing module 1A or 1B, and a post-cleaning mode in which the substrate W is transported to the cleaning module 7 after being removed from the polishing module 1A or 1B. In the pre-cleaning mode, the cleaning module 7 operates as a pre-cleaning module. Specifically, the operation controller 15 instructs the elevating transporter 5 to transport the substrate W from the substrate transporter 14 to the cleaning module 7 before transporting the substrate W to the polishing module 1A or 1B. The cleaning module 7 as the pre-cleaning module cleans the substrate W before polishing of the substrate W. In the post-cleaning mode, the cleaning module 7 operates as a post-cleaning module. Specifically, the operation controller 15 instructs the elevating transporter 5 to transport the polished substrate W from the polishing module 1A or 1B to the cleaning module 7. The cleaning module 7 as the post-cleaning module cleans the polished substrate W.

In the pre-cleaning mode, the polished substrate W is transported in an order of the cleaning module 8, the cleaning module 9, and the cleaning module 10, and is cleaned by these cleaning modules 8, 9, and 10. In the post-cleaning mode, the polished substrate W is transported in an order of the cleaning module 7, the cleaning module 8, the cleaning module 9, and the cleaning module 10, and is cleaned by these cleaning modules 7, 8, 9, and 10.

In the present embodiment, the elevating transporter 5 is configured to be accessible to the cleaning modules 7, 8, 9, and 10, and the relay transporter 6 is configured to be accessible to the cleaning module 10 and the drying module 11. Therefore, the elevating transporter 5 transports the polished substrate W with a low cleanliness (i.e., the polishing liquid and polishing debris are attached to the substrate W), and the relay transporter 6 transports the cleaned substrate W with a high cleanliness. Furthermore, using these two transporters, i.e. the elevating transporter 5 and the relay transporter 6, can make it possible to prevent transporting of the substrate from becoming a rate-limiting factor and can make it possible to process a plurality of substrates continuously.

In one embodiment, the elevating transporter 5 may have two holding hands 40 that are arranged one above the other and operate independently of each other. In one embodiment, the relay transporter 6 may have two holding hands 60 that are arranged one above the other and operate independently of each other. For example, the lower holding hand 40 can transport a wet substrate, and the upper holding hand 40 can transport a dry substrate. Similarly, the lower holding hand 60 can transport a wet substrate, and the upper holding hand 60 can transport a dry substrate.

In one embodiment, the elevating transporter 5 may be configured to be able to access all of the cleaning modules 7, 8, 9, 10 and the drying module 11. In this case, the loading and unloading of the substrate W into and out of the cleaning modules 7, 8, 9, 10 and the drying module 11 is performed by the elevating transporter 5.

The substrate transporter 14 includes a substrate stage 71 configured to support the substrate W, and a stage moving mechanism 72 configured to horizontally move the substrate stage 71. The substrate stage 71 is coupled to the stage moving mechanism 72. The stage moving mechanism 72 extends horizontally from one side to the opposite side of the first processing unit 101. More specifically, the stage moving mechanism 72 extends in a width direction of the first processing unit 101 and is arranged above the cleaning modules 7, 8, 9, 10 and the drying module 11. The substrate transporter 14 of this embodiment is a linear transporter that moves the substrate W in a straight line.

The stage moving mechanism 72 is configured to stop the substrate stage 71 at a first position P1, a second position P2, and a third position P3. The first position P1 is located at one side of the first processing unit 101, and the second position P2 is located at the opposite side of the first processing unit 101. The third position P3 is located between the first position P1 and the second position P2. More specifically, the first position P1 is above the cleaning modules 7, 8, and the second position P2 is above the cleaning modules 9, 10 and the drying module 11. The third position P3 is located between the group of cleaning modules 7, 8 and the group of cleaning modules 9, 10 and drying module 11.

The substrate processing apparatus includes a load-unload section 50 adjacent to the first processing unit 101. As shown in FIGS. 2 and 3, the load-unload section 50 includes a cassette loader 53 on which a cassette storage 100 containing a plurality of substrates W is placed, and a transfer robot 55 configured to remove one substrate W to be polished from the cassette storage 100 and transport the substrate to the substrate transporter 14. The transfer robot 55 is arranged between the cassette loader 53 and the substrate transporter 14.

The substrate processing apparatus further includes a horizontal movement mechanism 56 and a vertical movement mechanism 57 configured to move the transfer robot 55 horizontally and vertically. The transfer robot 55, the horizontal movement mechanism 56, and the vertical movement mechanism 57 are coupled to the operation controller 15 shown in FIG. 15 so that operations of the transfer robot 55, the horizontal movement mechanism 56, and the vertical movement mechanism 57 are controlled by the operation controller 15.

The vertical movement mechanism 57 is configured to move the transfer robot 55 up and down between the cassette storage 100 and the substrate transporter 14. Specifically, the transfer robot 55 removes one substrate W to be polished from the cassette storage 100, moves up to the substrate transporter 14 by the vertical movement mechanism 57, and places the substrate W onto the substrate stage 71 of the substrate transporter 14 of the first processing unit 101. Furthermore, the substrate W that has been processed (polished, cleaned, dried) by at least one of the first processing unit 101 and the second processing unit 102 is removed from the substrate stage 71 of the substrate transporter 14 of the first processing unit 101 by the transfer robot 55. The transfer robot 55 is lowered together with the processed substrate W by the vertical movement mechanism 57, and returns the processed substrate W to the cassette storage 100.

The polishing heads 25, 25 are suspended from a frame (not shown). More specifically, the support shaft 29 extends downward from the frame (not shown), and the head arm 28 is rotatably supported by a lower part of the support shaft 29. The arm rotation motor (not shown) configured to rotate the head arm 28 and the two polishing heads 25, 25 around the support shaft 29 is installed on the head arm 28 or the support shaft 29. The polishing module 1B also has a similar configuration.

Figure 4:
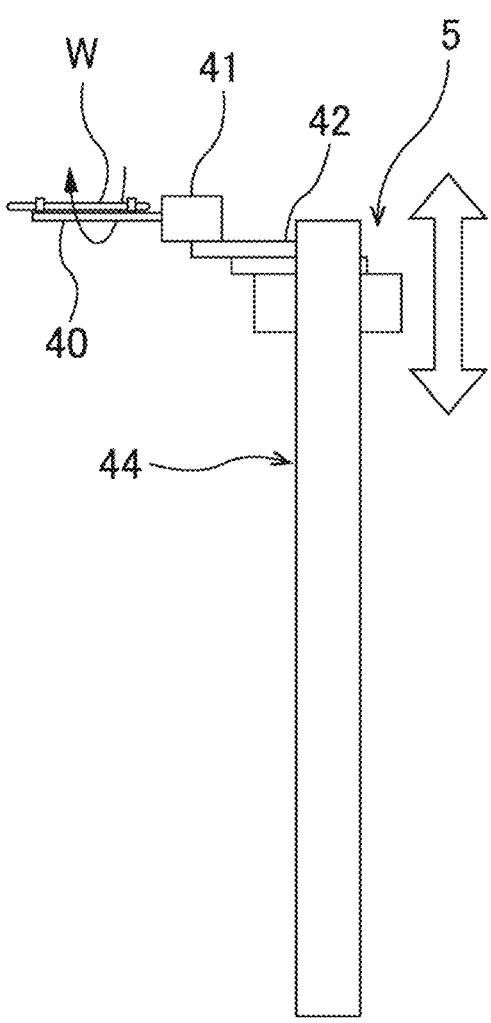
FIG. 4 is a diagram showing an embodiment of an elevating transporter.

FIG. 4 is a diagram illustrating an embodiment of the elevating transporter 5. As shown in FIG. 4, the elevating transporter 5 includes the holding hand 40 configured to hold the substrate W, an inverting device 41 configured to invert the holding hand 40, a robot arm 42 to which the inverting device 41 is fixed, and an elevating mechanism 44 configured to elevate and lower the holding hand 40, the inverting device 41, and the robot arm 42.

The holding hand 40 is configured to hold a peripheral edge of the substrate W such that the substrate W does not fall from the holding hand 40 when the substrate W and the holding hand 40 are inverted by the inverting device 41. The inverting device 41 is configured to rotate the holding hand 40 holding the substrate W around a horizontal axis until the substrate W is inverted.

Figure 5:
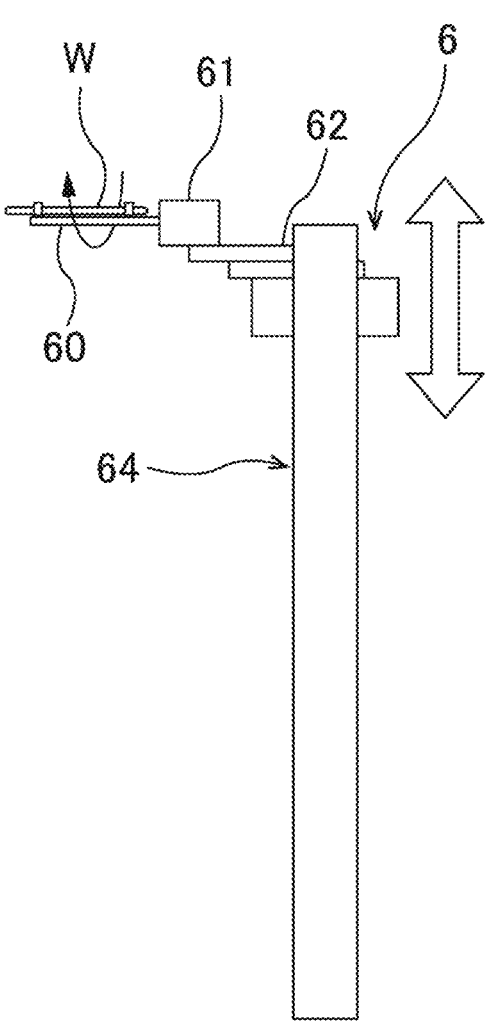
FIG. 5 is a diagram showing an embodiment of a relay transporter.

FIG. 5 is a diagram illustrating one embodiment of the relay transporter 6. The relay transporter 6 has basically the same configuration as the elevating transporter 5. Specifically, as shown in FIG. 5, the relay transporter 6 includes a holding hand 60 configured to hold the substrate W, an inverting device 61 configured to invert the holding hand 60, a robot arm 62 to which the inverting device 61 is fixed, and an elevating mechanism 64 configured to elevate and lower the holding hand 60, the inverting device 61, and the robot arm 62.

The holding hand 60 is configured to hold the peripheral edge of the substrate W such that the substrate W does not fall from the holding hand 60 when the substrate W and the holding hand 60 are inverted by the inverting device 61. The inverting device 61 is configured to rotate the holding hand 60 holding the substrate W around a horizontal axis until the substrate W is inverted.

As shown in FIGS. 1 to 3, the elevating transporter 5 is configured to be able to access the substrate stage 71 located at the third position P3 of the substrate transporter 14. The substrate W before polishing is transported by the substrate transporter 14 with the surface to be polished facing upward, and is stopped at the third position P3, as shown in FIG. 2. The holding hand 40 ascends to the substrate transporter 14 and removes the substrate from the substrate stage 71 located at the third position P3.

In the pre-cleaning mode described above, the elevating transporter 5 carries the substrate W to be polished into the cleaning module 7 with the surface to be polished facing upward. The substrate W is pre-cleaned by the cleaning module 7. The elevating transporter 5 removes the pre-cleaned substrate W from the cleaning module 7, and then the inverting device 41 of the elevating transporter 5 inverts the substrate W until the surface to be polished of the substrate W faces downward. Further, the elevating transporter 5 places the substrate W onto the substrate loader 33 of either the polishing module 1A or 1B.

In the above-mentioned post-cleaning mode, the elevating transporter 5 removes the substrate W before polishing from the substrate transporter 14, and then the inverting device 41 of the elevating transporter 5 inverts the substrate W until the surface to be polished of the substrate W faces downward. Further, the elevating transporter 5 places the substrate W onto the substrate loader 33 of either the polishing module 1A or 1B.

In both the pre-cleaning mode and the post-cleaning mode, the substrate W is inverted after the substrate W is removed from the substrate transporter 14 and before the substrate W is carried into either the polishing module 1A or 1B. The substrate W may be inverted before the substrate W is lowered, or when the substrate W is being lowered, or after the substrate W is lowered.

The substrate W that has been polished by either the polishing module 1A or 1B is released from the polishing head 25 onto the substrate loader 33 with the polished surface facing downward. The holding hand 40 of the elevating transporter 5 removes the polished substrate W from the substrate loader 33. Thereafter, the inverting device 41 of the elevating transporter 5 inverts the holding hand 40 and the substrate W such that the polished surface faces upward. Then, the substrate W is carried into the cleaning module 7 or 8.

In this way, the elevating transporter 5 can perform a series of operations including removing the substrate W from the polishing module, inverting the substrate W, and carrying the substrate W into the cleaning module. As a result, a time required for transporting the polished substrate W from the polishing module to the cleaning module can be shortened. In particular, since the polished substrate is directly carried into the cleaning module by the elevating transporter 5 (i.e., without passing through a temporary stand or the like), the time required to transport the polished substrate W can be shortened. As a result, corrosion of a metal on the surface of the substrate W can be prevented as much as possible.

The polished substrate W is cleaned by at least one of the plurality of cleaning modules 7, 8, 9, and 10. In one example, the polished substrate W is transported by the elevating transporter 5 in the order of the cleaning module 8, the cleaning module 9, and the cleaning module 10, and is cleaned by these cleaning modules 8, 9, and 10. The cleaned substrate W is transported from the cleaning module 10 to the drying module 11 by the relay transporter 6, and is dried by the drying module 11. The substrate W that has been processed in this manner (i.e., polished, cleaned, and dried) is transported onto the substrate stage 71 at the second position P2 of the substrate transporter 14 of the first processing unit 101 by the relay transporter 6 of the first processing unit 101. The substrate transporter 14 transports the substrate W from the second position P2 to the first position P1. The transfer robot 55 removes the substrate W from the substrate transporter 14 and returns the substrate W to the cassette storage 100.

Figure 6A:
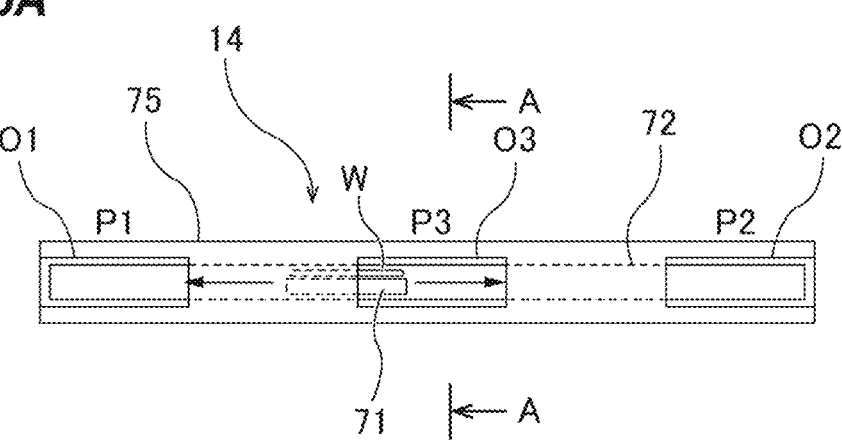
FIG. 6A is a side view showing an embodiment of a substrate transporter.
Figure 6B:
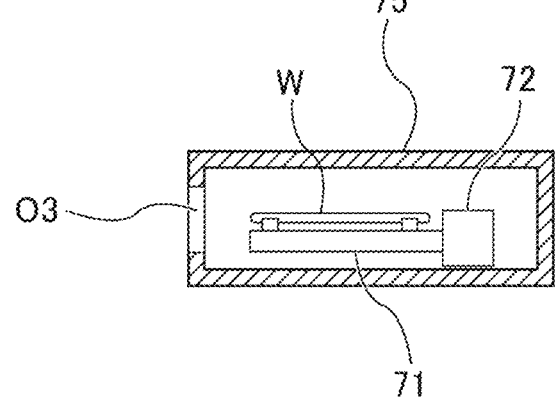
FIG. 6B is a cross-sectional view taken along line A-A in FIG. 6A.

FIG. 6A is a side view showing an embodiment of the substrate transporter 14, and FIG. 6B is a cross-sectional view taken along line A-A in FIG. 6A. The substrate transporter 14 of the embodiment shown in FIGS. 6A and 6B includes a tunnel cover 75 that covers entireties of the substrate stage 71 and the stage moving mechanism 72. The tunnel cover 75 extends from the first position P1 to the second position P2 along a longitudinal direction of the stage moving mechanism 72. The substrate stage 71 is movable inside the tunnel cover 75. Since the tunnel cover 75 always covers the substrate W on the moving substrate stage 71, the substrate W can be protected from foreign substances, such as particles, and the cleanliness of the substrate W can be maintained.

The tunnel cover 75 has a first opening O1 at the first position P1, a second opening O2 at the second position P2, and a third opening O3 at the third position P3. A shutter (not shown) is provided at each of the first opening O1, the second opening O2, and the third opening O3. The elevating transporter 5 can remove the substrate W from the substrate stage 71 through the third opening O3. The relay transporter 6 can transport the substrate W to the substrate stage 71 through the second opening O2 and can remove the substrate W from the substrate stage 71 through the second opening O2. The transfer robot 55 can transport the substrate W to the substrate stage 71 through the first opening O1 of the first processing unit 101 and can remove the substrate W from the substrate stage 71 through the first opening O1 of the first processing unit 101. The relay transporter 6 can transport the substrate W to the substrate stage 71 through the first opening O1 of the substrate transporter 14 of the second processing unit 102, and can remove the substrate W from the substrate stage 71 through the first opening O1 of the substrate transporter 14 of the second processing unit 102. The first opening O1 of the first processing unit 101 and the first opening O1 of the second processing unit 102 may be provided at different positions or angles with respect to the substrate stage 71 located at the first position P1.

Figure 7A:
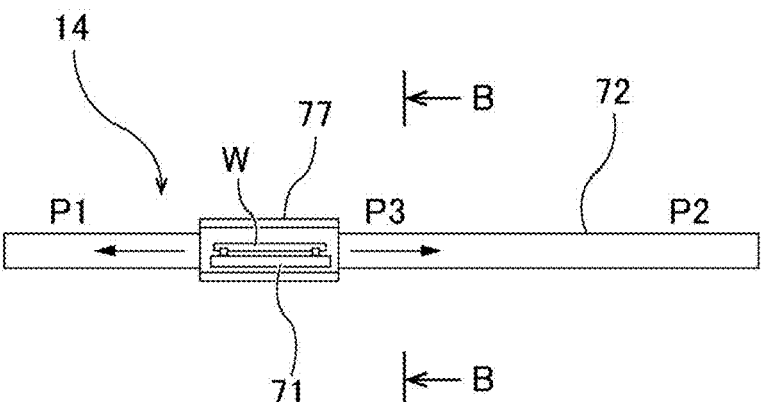
FIG. 7A is a side view showing another embodiment of the substrate transporter.
Figure 7B:
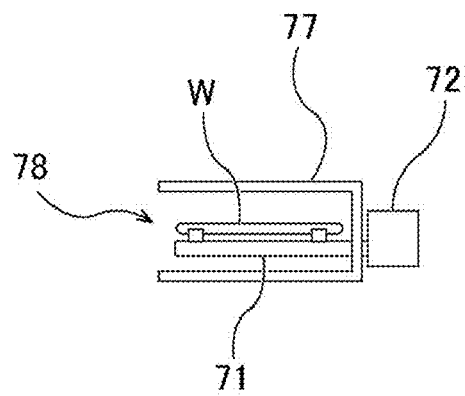
FIG. 7B is a cross-sectional view taken along line B-B in FIG. 7A.

FIG. 7A is a side view showing another embodiment of the substrate transporter 14, and FIG. 7B is a cross-sectional view taken along line B-B in FIG. 7A. The substrate transporter 14 shown in FIGS. 7A and 7B includes a stage cover 77 that covers the entire substrate stage 71. The stage cover 77 is fixed to the substrate stage 71 and is movable together with the substrate stage 71. Since the stage cover 77 always covers the substrate W on the moving substrate stage

71, the substrate W can be protected from foreign substances, such as particles, and the cleanliness of the substrate W can be maintained.

The substrate W is transported into and out of the substrate transporter 14 at each of the first position P1, second position P2, and third position P3 through an opening 78 of the stage cover 77. The stage cover 77 may have a wall on a moving direction side. A shutter may be provided at the opening 78 of the stage cover 77. The tunnel cover 75 in FIG. 6 and the stage cover 77 in FIG. 7 may be combined.

Figure 8:
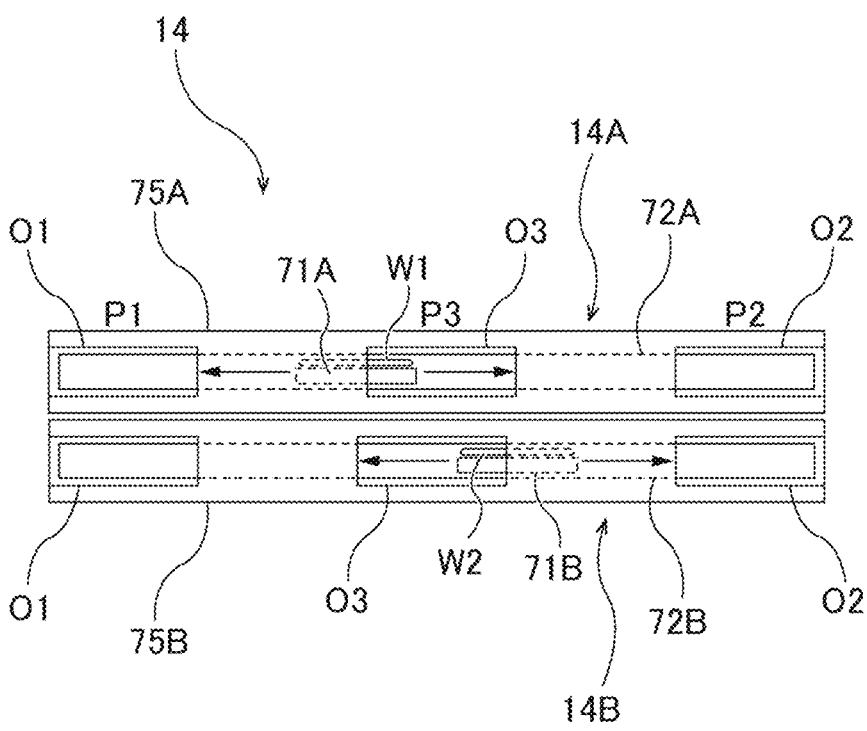
FIG. 8 is a side view showing still another embodiment of the substrate transporter.

FIG. 8 is a side view showing still another embodiment of the substrate transporter 14. The substrate transporter 14 shown in FIG. 8 includes two sets of substrate transporters 14 shown in FIGS. 6A and 6B. Specifically, the substrate transporter 14 shown in FIG. 8 includes an upper substrate transporter 14A and a lower substrate transporter 14B. The upper substrate transporter 14A is arranged over the lower substrate transporter 14B.

The upper substrate transporter 14A includes an upper substrate stage 71A configured to support a substrate W1, an upper stage moving mechanism 72A configured to horizontally move the upper substrate stage 71A, and an upper tunnel cover 75A that covers entireties of the upper substrate stage 71A and the upper stage moving mechanism 72A. The upper substrate stage 71A is coupled to the upper stage moving mechanism 72A.

The lower substrate transporter 14B includes a lower substrate stage 71B configured to support a substrate W2, an lower stage moving mechanism 72B configured to horizontally move the lower substrate stage 71B, and an lower tunnel cover 75B that covers entireties of the lower substrate stage 71B and the lower stage moving mechanism 72B. The lower substrate stage 71B is coupled to the lower stage moving mechanism 72B.

The upper substrate stage 71A, the upper stage moving mechanism 72A, and the upper tunnel cover 75A are arranged over the lower substrate stage 71B, the lower stage moving mechanism 72B, and the lower tunnel cover 75B. The upper stage moving mechanism 72A and the lower stage moving mechanism 72B can independently move the upper substrate stage 71A and the lower substrate stage 71B. Therefore, for example, the substrate transporter 14 can transport the substrate W1 to the first processing unit 101 while transporting the substrate W2 to the second processing unit 102. As a result, a throughput of substrate processing can be improved.

Figure 9:
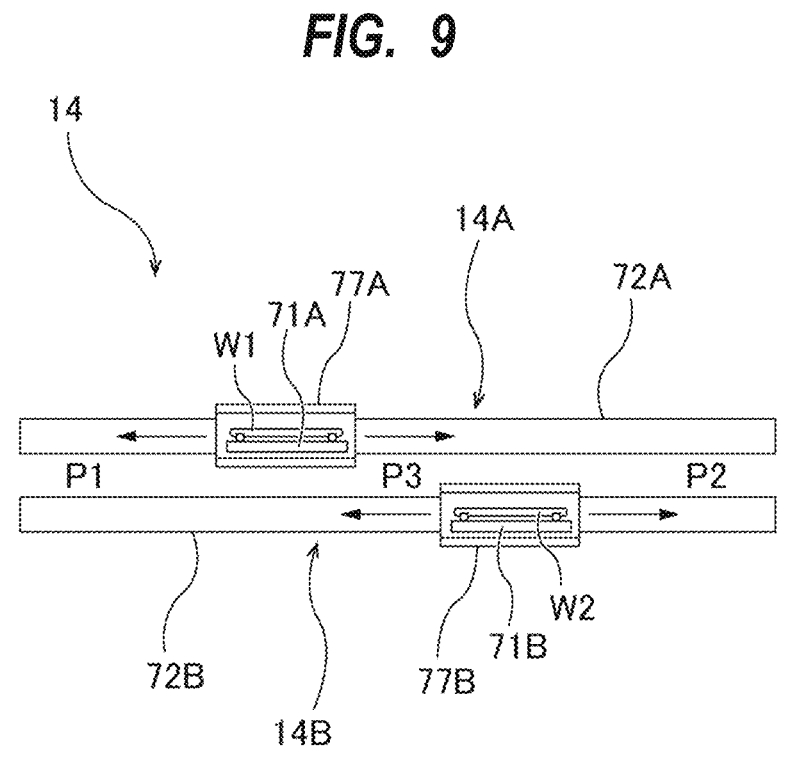

FIG. 9 is a side view showing still another embodiment of the substrate transporter 14. The substrate transporter 14 shown in FIG. 9 has two sets of substrate transporters 14 shown in FIGS. 7A and 7B. Specifically, the substrate transporter 14 shown in FIG. 9 includes an upper substrate transporter 14A and a lower substrate transporter 14B. The upper substrate transporter 14A is arranged over the lower substrate transporter 14B.

The upper substrate transporter 14A includes an upper substrate stage 71A configured to support a substrate W1, an upper stage moving mechanism 72A configured to horizontally move the upper substrate stage 71A, and an upper stage cover 77A that covers the entire upper substrate stage 71A. The lower substrate transporter 14B includes a lower substrate stage 71B configured to support a substrate W2, a lower stage moving mechanism 72B configured to horizontally move the lower substrate stage 71B, and a lower stage cover 77B that covers the entire lower substrate stage 71B.

The upper substrate stage 71A, the upper stage moving mechanism 72A, and the upper stage cover 77A are arranged over the lower substrate stage 71B, the lower stage moving mechanism 72B, and the lower stage cover 77B. The upper stage moving mechanism 72A and the lower stage moving mechanism 72B can independently move the upper substrate stage 71A and the lower substrate stage 71B. Therefore, for example, the substrate transporter 14 can transport the substrate W1 to the first processing unit 101 while transporting the substrate W2 to the second processing unit 102. As a result, a throughput of substrate processing can be improved.

In the embodiment shown in FIG. 8 or 9, the upper substrate transporter 14A may be used for a dedicated transportation route for returning the substrate W after substrate processing (polishing, cleaning, drying) to the load-unload section 50. The substrate W that has been dried by the drying module 11 of the first processing unit 101 is removed from the drying module 11 by the relay transporter 6, placed on the upper substrate stage 71A of the upper substrate transporter 14A, and transported to the load-unload section 50. In this way, the upper substrate transporter 14A and the lower substrate transporter 14B may be used for a transportation route for transporting a substrate W that has been processed and a transportation route for transporting a substrate W to be processed. As a result, a throughput of substrate processing can be improved.

Figure 10A:
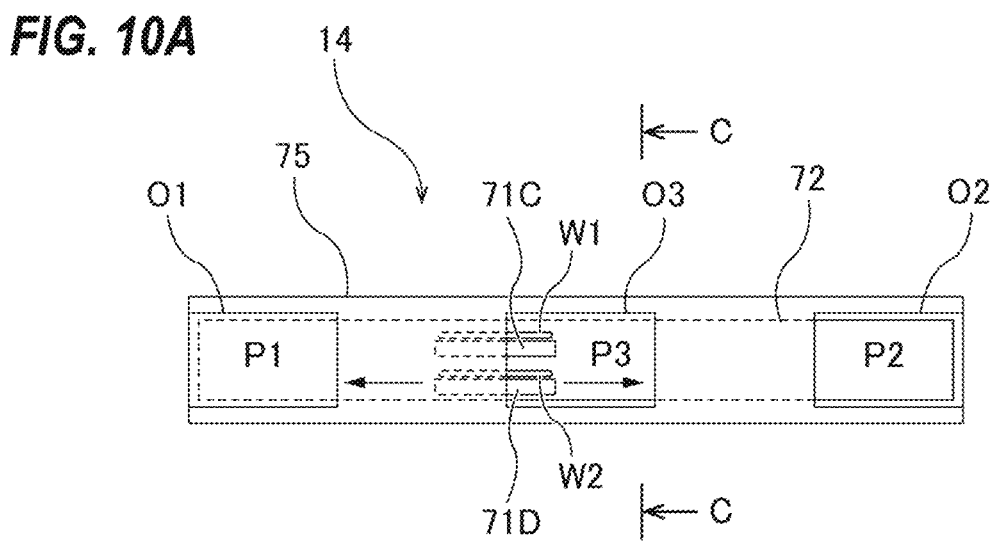
FIG. 10A is a side view showing still another embodiment of the substrate transporter.
Figure 10B:
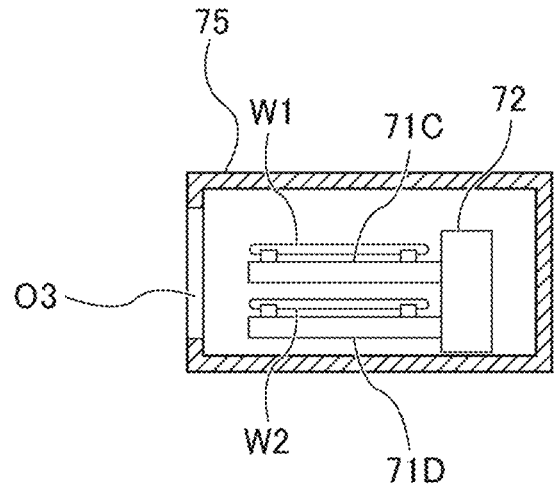
FIG. 10B is a cross-sectional view taken along line C-C in FIG. 10A.

FIG. 10A is a side view showing still another embodiment of the substrate transporter 14, and FIG. 10B is a cross-sectional view taken along line C-C in FIG. 10A. The substrate transporter 14 shown in FIGS. 10A and 10B includes an upper substrate stage 71C and a lower substrate stage 71D arranged along the vertical direction, and a stage moving mechanism 72 configured to horizontally move the upper substrate stage 71C and the lower substrate stage 71D, and a tunnel cover 75 that covers the entireties of the upper substrate stage 71C, the lower substrate stage 71D, and the stage moving mechanism 72.

The upper substrate stage 71C and the lower substrate stage 71D are coupled to the stage moving mechanism 72, so that the upper substrate stage 71C and the lower substrate stage 71D are moved together by the stage moving mechanism 72. The tunnel cover 75 has a first opening O1 at the first position P1, a second opening O2 at the second position P21, and a third opening O3 at the third position P3. The tunnel cover 75 extends from the first position P1 to the second position P2 along a longitudinal direction of the stage moving mechanism 72. The upper substrate stage 71C and the lower substrate stage 71D are movable inside the tunnel cover 75.

The upper substrate stage 71C and the lower substrate stage 71D can simultaneously transport substrates W1 and W2. Therefore, for example, after the substrate W1 is removed from the upper substrate stage 71C by the elevating transporter 5 of the first processing unit 101 at the third position P3, the lower substrate stage 71D transports the substrate W2 to the second position P2, and the relay transporter 6 of the second processing unit 102 can remove the substrate W2 from the lower substrate stage 71D. As a result, a throughput of substrate processing can be improved. In this embodiment, the transfer robot 55 (see FIG. 2) of the load-unload section 50 is desirably configured to transport two substrates simultaneously.

Figure 11A:
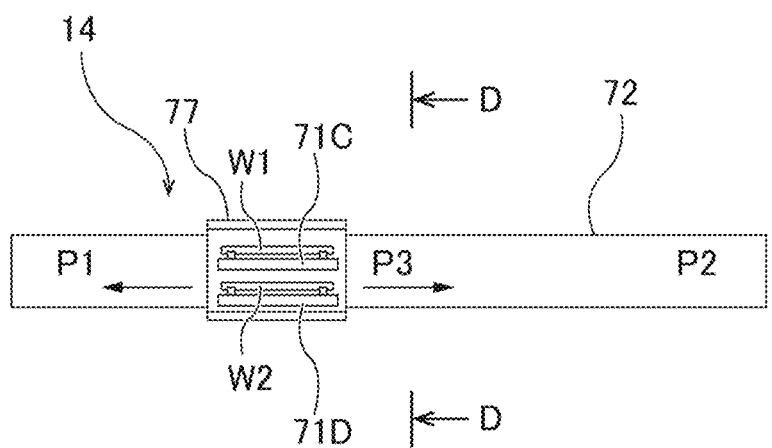
FIG. 11A is a side view showing still another embodiment of the substrate transporter.
Figure 11B:
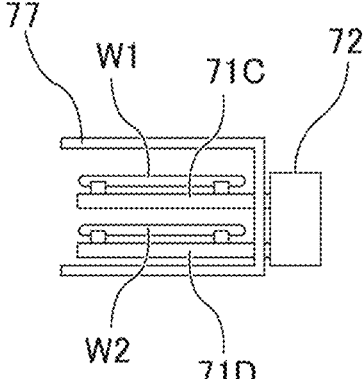
FIG. 11B is a cross-sectional view taken along line D-D in FIG. 11A.

FIG. 11A is a side view showing still another embodiment of the substrate transporter 14, and FIG. 11B is a cross-sectional view taken along line D-D in FIG. 11A. The substrate transporter 14 shown in FIGS. 11A and 11B includes an upper substrate stage 71C and a lower substrate stage 71D arranged along the vertical direction, a stage moving mechanism 72 configured to horizontally move the upper substrate stage 71C and the lower substrate stage 71D, and a stage cover 77 that covers entireties of the upper substrate stage 71C and the lower substrate stage 71D.

The upper substrate stage 71C and the lower substrate stage 71D are coupled to the stage moving mechanism 72. The stage cover 77 is fixed to at least one of the upper substrate stage 71C and the lower substrate stage 71D. The upper substrate stage 71C, the lower substrate stage 71D, and the stage cover 77 are moved together by the stage moving mechanism 72.

The upper substrate stage 71C and the lower substrate stage 71D can simultaneously transport substrates W1 and W2. Therefore, for example, after the substrate W1 is removed from the upper substrate stage 71C by the elevating transporter 5 of the first processing unit 101 at the third position P3, the lower substrate stage 71D can transport the substrate W2 to the second position P2, and the relay transporter 6 of the second processing unit 102 can remove the substrate W2 from the lower substrate stage 71D. As a result, a throughput of substrate processing can be improved. In this embodiment, it is preferable that the transfer robot 55 (see FIG. 2) of the load-unload section 50 is configured to transport two substrates simultaneously.

As shown in FIG. 3, when viewed from above the elevating transporter 5, the two polishing modules 1A and 1B (more specifically, the substrate loaders 33 of the polishing modules 1A and 1B) are located at the same distance from the elevating transporter 5 (more specifically, a home position of the holding hand 40). Therefore, the elevating transporter 5 can transport a plurality of substrates polished by the two polishing modules 1A and 1B to the same cleaning module (e.g., the cleaning module 8) in substantially the same transport time.

When viewed from above the elevating transporter 5, distances from the plurality of polishing modules of each of the first processing unit 101 and the second processing unit 102 to the elevating transporter 5 of each processing unit are the same. Specifically, when viewed from above the elevating transporter 5, the distances from the polishing modules 1A, 1B of the first processing unit 101 to the elevating transporter 5 of the first processing unit 101 are the same as the distances of the polishing modules 1C, 1D of the second processing unit 102 to the elevating transporter 5 of the second processing unit 102. In addition, when viewed from above the elevating transporter 5, distances from the plurality of cleaning modules of each of the first processing unit 101 and the second processing unit 102 to the elevating transporter 5 of each processing unit are also the same. Specifically, when viewed from above the elevating transporter 5, the distances from the cleaning modules 7, 8, 9, 10 of the first processing unit 101 to the elevating transporter 5 of the first processing unit 101 are the same as the distances from the cleaning modules 7, 8, 9, 10 to the elevating transporter 5 of the second processing unit 102. Therefore, a plurality of substrates polished by the plurality of polishing modules of the first processing unit 101 and the second processing unit 102 can be transported to the cleaning module in substantially the same transport time.

As shown in FIG. 3, the relay transporter 6 of the first processing unit 101 is arranged between the first processing unit 101 and the second processing unit 102. The two polishing modules 1A and 1B of the first processing unit 101 and the two polishing modules 1C and 1D of the second processing unit 102 are arranged along a horizontal direction at equal intervals. Similarly, the elevating transporter 5 and the relay transporter 6 of the first processing unit 101 and the elevating transporter 5 and the relay transporter 6 of the second processing unit 102 are arranged at equal intervals. Arrangement intervals of the four polishing modules 1A, 1B, 1C, 1D of the first processing unit 101 and the second processing unit 102 are the same as arrangement intervals of the two elevating transporters 5 and the two relay transporters 6 of the first processing unit 101 and the second processing unit 102. As shown in FIG. 3, the elevating transporter 5 of the first processing unit 101 is located at the same distance from the polishing modules 1A and 1B, and the relay transporter 6 of the first processing unit 101 is located at the same distance from the polishing modules 1B and 1C.

The second position P2 of the substrate transporter 14 of the first processing unit 101 is adjacent to the first position P1 of the substrate transporter 14 of the second processing unit 102. The relay transporter 6 of the first processing unit 101 is configured to be accessible to both the second position P2 of the substrate transporter 14 of the first processing unit 101 and the first position P1 of the substrate transporter 14 of the second processing unit 102. Therefore, the relay transporter 6 of the first processing unit 101 can remove the substrate W from the substrate stage 71 located at the second position P2 of the substrate transporter 14 of the first processing unit 101 and place the substrate W on the substrate stage 71 located at the first position P1 of the substrate transporter 14 of the second processing unit 102. For example, a first substrate can be processed in the first processing unit 101, while a second substrate can be transported to the second processing unit 102 via the substrate transporter 14 and the relay transporter 6 of the first processing unit 101, so that the second substrate can be processed in the second processing unit 102.

The relay transporter 6 of the first processing unit 101 is configured to be accessible to the polishing module 1B, the cleaning module 10, and the drying module 11 of the first processing unit 101, and the polishing module 1C and the cleaning modules 7, 8 of the second processing unit 102. As shown in FIG. 3, when viewed from above the relay transporter 6 of the first processing unit 101, a distance from the relay transporter 6 of the first processing unit 101 to the polishing module 1B of the first processing unit 101 is the same as a distance from the relay transporter 6 of the first processing unit 101 to the polishing module 1C of the second processing unit 102. Furthermore, when viewed from above the relay transporter 6 of the first processing unit 101, a distance from the relay transporter 6 of the first processing unit 101 to the cleaning module 10 and the drying module 11 of the first processing unit 101 is the same as a distance from the relay transporter 6 of the first processing unit 101 to the cleaning modules 7 and 8 of the second processing unit 102.

In one example, the relay transporter 6 of the first processing unit 101 removes the substrate W from the substrate loader 33 of the polishing module 1B of the first processing unit 101, and can directly transport the substrate W to the substrate loader 33 of the polishing module 1C of the second processing unit 102. Therefore, the substrate processing apparatus polishes the substrate W by at least one of the two polishing modules 1A and 1B of the first processing unit 101, and then the relay transporter 6 of the first processing unit 101 can directly transport the substrate W from the polishing module 1B of the first processing unit 101 to the polishing module 1C of the second processing unit 102 without passing through the substrate transporter 14, so that at least one of the two polishing modules 1C, 1D of the second processing unit 102 can further polish the substrate W.

In another example, the relay transporter 6 of the first processing unit 101 removes the substrate W from the substrate loader 33 of the polishing module 1B of the first processing unit 101, and can directly transport the substrate W to either one of the cleaning modules 7, 8 of the second processing unit 102. Such a transportation route is adopted when any one of the cleaning modules 7, 8, 9, 10 and the drying module 11 of the first processing unit 101 is out of order.

In yet another example, the relay transporter 6 of the first processing unit 101 removes the substrate W from the substrate loader 33 of the polishing module 1C of the second processing unit 102, and can directly transport the substrate W to the substrate loader 33 of the polishing module 1B of the first processing unit 101. Therefore, the substrate processing apparatus polishes the substrate W by at least one of the two polishing modules 1C and 1D of the second processing unit 102, and then the relay transporter 6 of the first processing unit 101 can transport the substrate W from the polishing module 1C of the second processing unit 102 to the polishing module 1B of the first processing unit 101 without passing through the substrate transporter 14, so that at least one of the two polishing modules 1A and 1B of the first processing unit 101 can further polish the substrate W.

As shown in FIG. 3, the elevating transporter 5 and the relay transporter 6 of the first processing unit 101 and the elevating transporter 5 and the relay transporter 6 of the second processing unit 102 are arranged alternately at equal intervals. Furthermore, the plurality of polishing modules 1A and 1B of the first processing unit 101 and the plurality of polishing modules 1C and 1D of the second processing unit 102 are also arranged at equal intervals. The arrangement intervals of the elevating transporters 5 and the relay transporters 6 of the first processing unit 101 and the second processing unit 102 are the same as the arrangement intervals of the polishing modules 1A, 1B, 1C, and 1D of the first processing unit 101 and the second processing unit 102.

With the above arrangements, the relay transporter 6 of the first processing unit 101 can directly transport the substrate W between the polishing module 1B of the first processing unit 101 and the polishing module 1C of the processing unit 102 without passing through the substrate transporter 14. Therefore, the substrate processing apparatus can polish the substrate W in multiple stages using three or four of the polishing modules 1A, 1B, 1C, and 1D. The substrate W that has been polished, cleaned, and dried in the second processing unit 102 is transported to the load-unload section 50 by the substrate transporter 14 of the second processing unit 102 and the relay transporter 6 and the substrate transporter 14 of the first processing unit 101.

Figure 12:
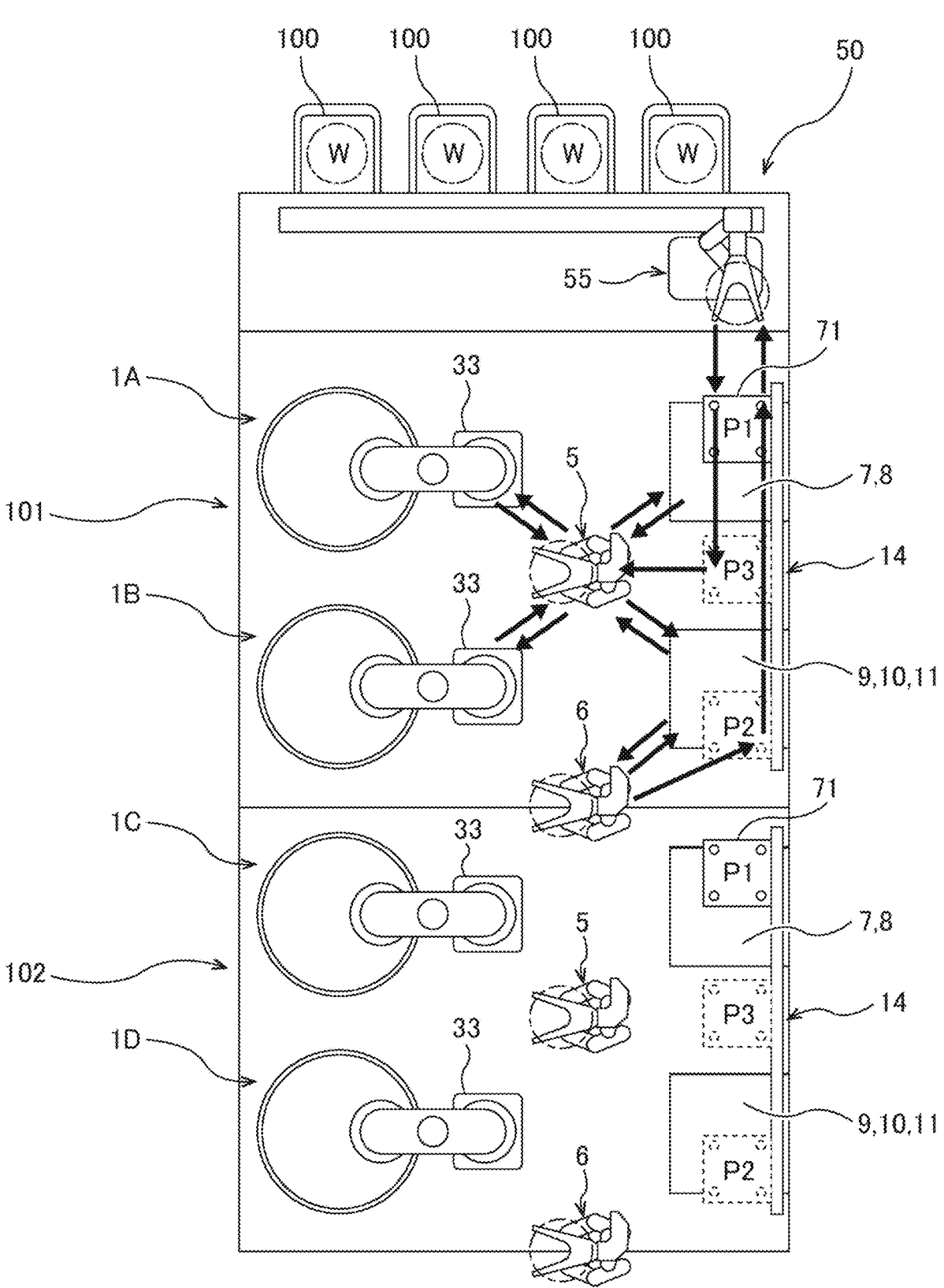
FIG. 12 is a diagram showing an example of a substrate transportation route and a processing sequence.

FIG. 12 is a diagram showing an example of a transportation route of the substrate W and processing sequence. The substrate W is transported from the cassette storage 100 to the first position P1 of the substrate transporter 14 of the first processing unit 101 by the transfer robot 55. The substrate transporter 14 transports the substrate W from the first position P1 to the third position P3. In the first processing unit 101, the substrate W is transported by the elevating transporter 5 in the order of the cleaning module (pre-cleaning module) 7, the polishing module 1A, the polishing module 1B, and the cleaning modules 8, 9, and 10. Further, the substrate W is transported by the relay transporter 6 in the order of the drying module 11 and the second position P2 of the substrate transporter 14. Then, the substrate W that has been processed (i.e., polished, cleaned, dried) by the first processing unit 101 is transported from the second position P2 to the first position P1 by the substrate transporter 14, and returned to the cassette storage 100 by the transfer robot 55.

In the example shown in FIG. 12, two-stage polishing of the substrate W is performed by the two polishing modules 1A and 1B, while in another example, only one of the two polishing modules 1A and 1B may be used to polish the substrate W. In one embodiment, the cleaning module 7 may be used as the post-cleaning module rather than the pre-cleaning module. In one embodiment, at least one of the four cleaning modules 7, 8, 9, 10 may be used as the post-cleaning module.

Figure 13:
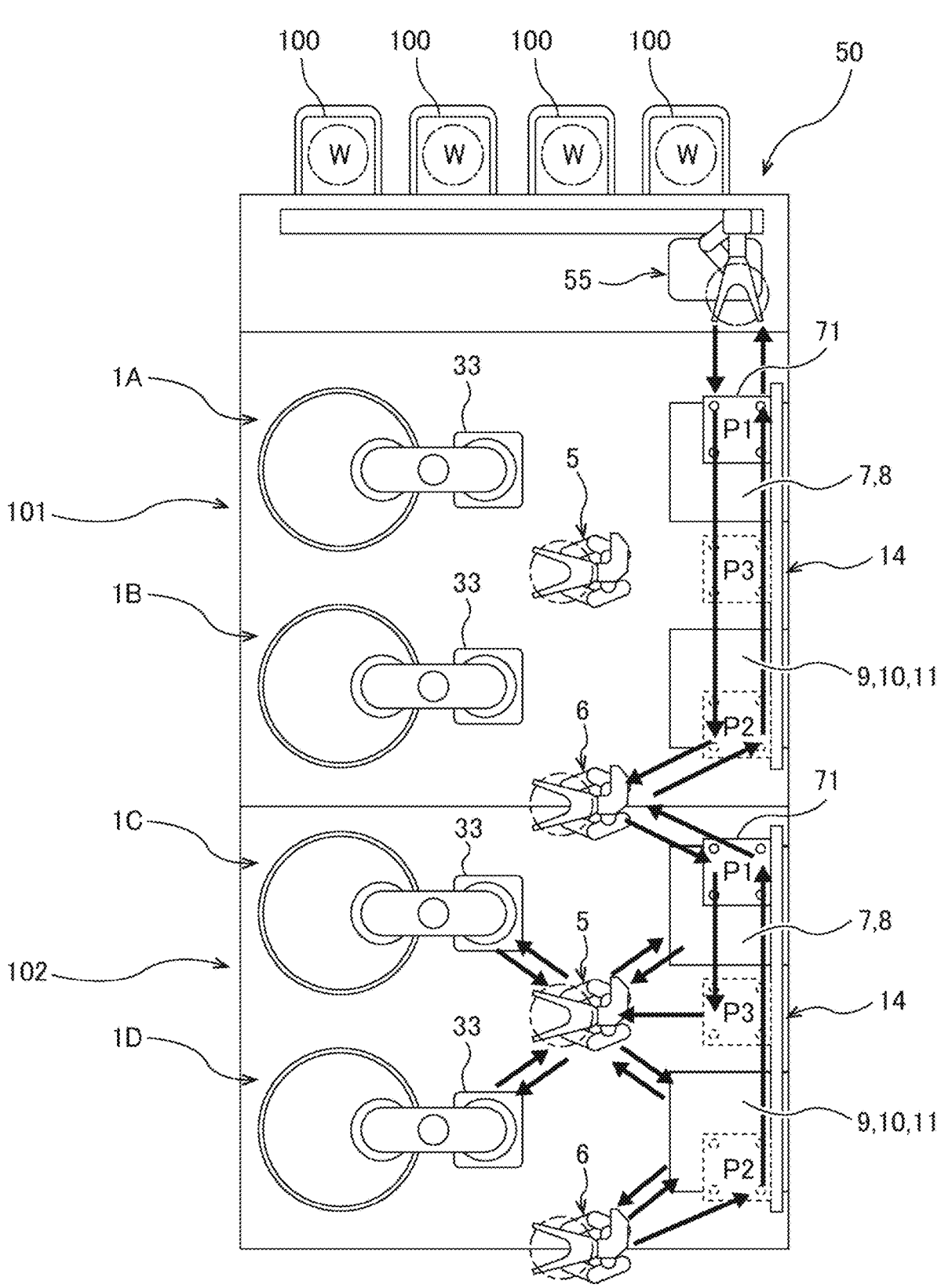
FIG. 13 is a diagram showing another example of the substrate transportation route and the processing sequence.

FIG. 13 is a diagram showing another example of the transportation route of the substrate W and the processing sequence. The substrate W is transported from the cassette storage 100 to the substrate transporter 14 of the first processing unit 101 by the transfer robot 55. The substrate W is transported from the first position P1 to the second position P2 by the substrate transporter 14. Further, the substrate W is transported from the second position P2 of the substrate transporter 14 of the first processing unit 101 to the first position P1 of the substrate transporter 14 of the second processing unit 102 by the relay transporter 6 of the first processing unit 101. The substrate transporter 14 of the second processing unit 102 transports the substrate W from the first position P1 to the third position P3. In the second processing unit 102, the substrate W is transported by the elevating transporter 5 in the order of the cleaning module (pre-cleaning module) 7, the polishing module 1C, the polishing module 1D, and the cleaning modules 8, 9, and 10. Further, the substrate W is transported by the relay transporter 6 in the order of the drying module 11 and the second position P2 of the substrate transporter 14.

The substrate W that has been processed (i.e., polished, cleaned, dried) by the second processing unit 102 is transported from the second position P2 to the first position P1 by the substrate transporter 14 of the second processing unit 102, and then the substrate is transported by the relay transporter 6 of the first processing unit 101 to the second position P2 of the substrate transporter 14 of the first processing unit 101. The substrate W is transported from the second position P2 to the first position P1 by the substrate transporter 14 of the first processing unit 101, and is returned to the cassette storage 100 by the transfer robot 55.

The relay transporter 6 may not be unitized as a part of the first processing unit 101 and the second processing unit 102. Specifically, the relay transporter 6 may be coupled to the first processing unit 101 and/or the second processing unit 102 after the first processing unit 101 and the second processing unit 102 are assembled as respective units. Furthermore, the relay transporter 6 of the second processing unit 102 may have a different structure from that of the relay transporter 6 of the first processing unit 101.

In the example shown in FIG. 13, two-stage polishing of the substrate W is performed by the two polishing modules 1C and 1D, while in another example, only one of the two polishing modules 1C and 1D may be used to polish the substrate W. In one embodiment, the cleaning module 7 may be used as the post-cleaning module rather than the pre-cleaning module. In one embodiment, at least one of the four cleaning modules 7, 8, 9, 10 may be used as the post-cleaning module.

The processing of the substrate in the first processing unit 101 shown in FIG. 12 and the processing of the substrate in the second processing unit 102 shown in FIG. 13 may be performed in parallel or may be performed alternately.

Figure 14:
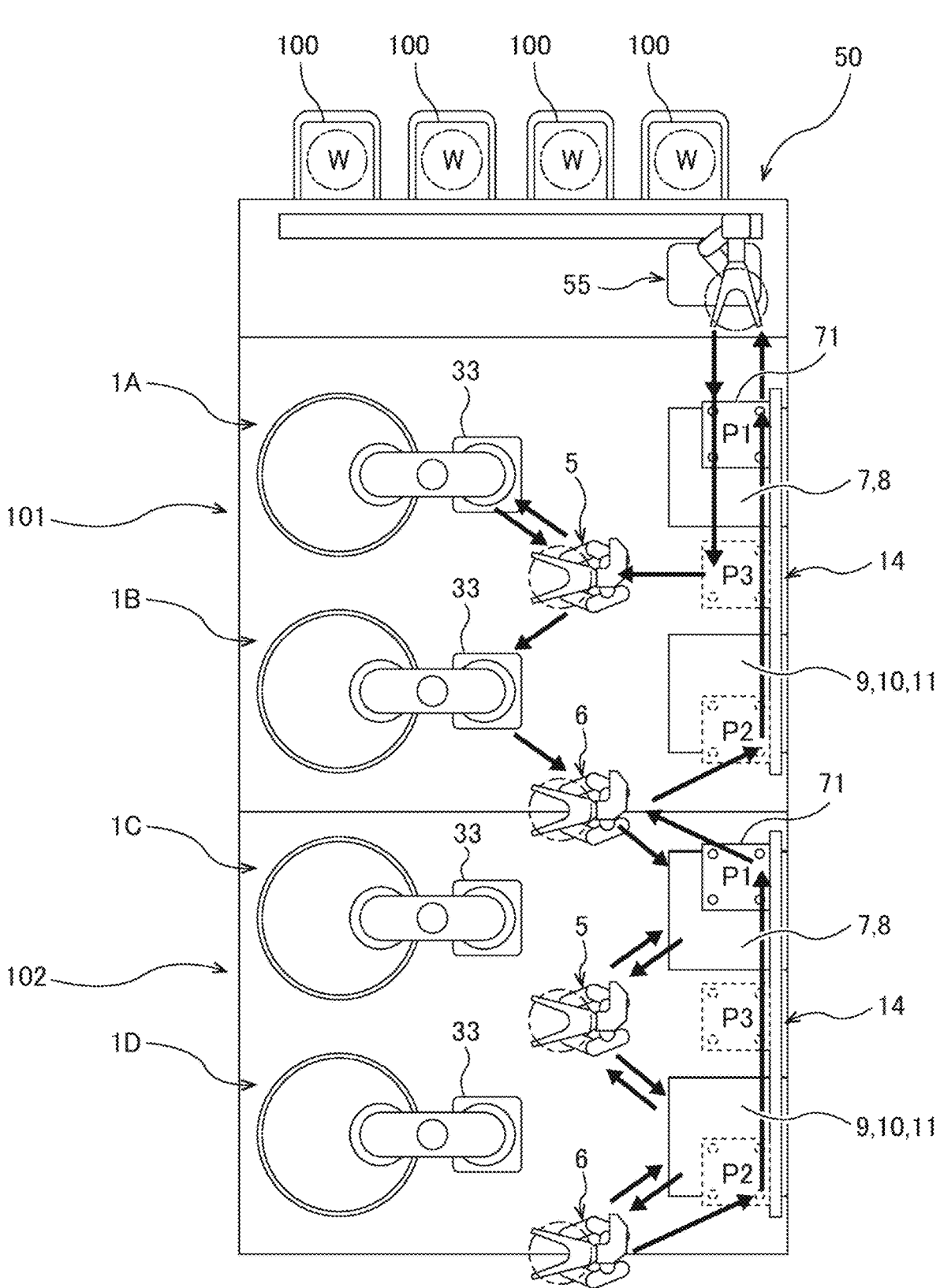
FIG. 14 is a diagram showing still another example of the substrate transportation route and the processing sequence.

FIG. 14 is a diagram showing still another example of the transportation route of the substrate W and the processing sequence. This example shows a rescue route when a malfunction occurs in any of the cleaning modules 7, 8, 9, 10 and the drying module 11 of the first processing unit 101. After the substrate W is polished by the polishing modules 1A and 1B of the first processing unit 101, the relay transporter 6 of the first processing unit 101 removes the substrate W from the polishing module 1B, and transports the substrate W directly to the cleaning module 8 of the second processing unit 102. In the second processing unit 102, the substrate W is transported by the elevating transporter 5 in the order of the cleaning modules 8, 9, and 10. Further, the substrate W is transported in the order of the drying module 11 and the second position P2 of the substrate transporter 14 by the relay transporter 6.

The substrate W that has been polished by the first processing unit 101 and cleaned and dried by the second processing unit 102 is transported from the second position P2 to the first position P1 by the substrate transporter 14 of the second processing unit 102. The substrate W is further transported to the second position P2 of the substrate transporter 14 of the first processing unit 101 by the relay transporter 6 of the first processing unit 101. The substrate W is transported from the second position P2 to the first position P1 by the substrate transporter 14 of the first processing unit 101, and is returned to the cassette storage 100 by the transfer robot 55.

In this way, even if any of the cleaning modules 7, 8, 9, 10 and the drying module 11 of the first processing unit 101 is out of order, the cleaning modules 7, 8, 9, 10 and the drying module 11 of the second processing unit 102 can be used to clean and dry the substrate W. Similarly, if any of the cleaning modules 7, 8, 9, 10 and the drying module 11 of the second processing unit 102 is out of order, the cleaning modules 7, 8, 9, 10 and the drying module 11 of the first processing unit 101 can be used to clean and dry the substrate W.

Each of the first processing unit 101 and the second processing unit 102 includes a plurality of consumables. Examples of the consumables include the polishing pad of each polishing module, a membrane for pressing a substrate against the polishing pad, a retainer ring of each polishing head for retaining a substrate, a dresser disk for dressing the polishing pad, and a scrub cleaning tool for cleaning a substrate. These consumables are replaced periodically to maintain intended polishing and cleaning performance.

Therefore, in order to replace consumables, it is necessary to stop the operations of the first processing unit 101 and the second processing unit 102 for the maintenance. However, if the operations of both the first processing unit 101 and the second processing unit 102 are stopped at the same time, the substrate processing apparatus cannot process a substrate during that time, resulting in a decrease in throughput.

Therefore, the operation controller 15 is configured to predict maintenance times (each of which is an operation time of replacing consumables) of the first processing unit 101 and the second processing unit 102, and control an operating rate of at least one of the first processing unit 101 and the second processing unit 102 so as to prevent overlapping of the maintenance times of the first processing unit 101 and the second processing unit 102. The operating rate of the processing unit is represented by the number of substrates processed by the processing unit per unit time. The unit time is a predetermined period.

The operation controller 15 is configured to calculate a first maintenance index value related to maintenance of a consumable in the first processing unit 101 and a second maintenance index value related to maintenance of a consumable in the second processing unit 102. The first maintenance index value is calculated for a consumable that is expected to reach its replacement time earliest among a plurality of consumables in the first processing unit 101. Similarly, the second maintenance index value is calculated for a consumable that is expected to reach its replacement time earliest among a plurality of consumables in the second processing unit 102.

Examples of the maintenance index value are as follows.
cumulative use time of a consumable When a cumulative use time of a consumable has reached a predetermined limit use time, the consumable is replaced. The cumulative use time of the consumable may be represented by the cumulative number of substrates processed using that consumable (i.e., the cumulative number of processed substrates). When the cumulative number of processed substrates for a consumable has reached a processing limit number, the consumable is replaced.

Time to reach the end of service life of consumable

A degree of deterioration of a consumable is measured by a sensor or the like, and the operation controller 15 estimates the number of substrates that can be processed using the consumable or a time the consumable can be used. For example, a thickness of the retainer ring is measured by a measuring device, and the operation controller 15 estimates the number of processed substrates or the time required until the retainer ring wears down to a predetermined thickness. Alternatively, the operation controller 15 may determine the time to reach the end of service life based on an evaluation value (e.g., surface uniformity) regarding the processed substrate.

Figure 15:
FIG. 15 is a graph showing changes in a first maintenance index value and a second maintenance index value over time.
Figure 15:
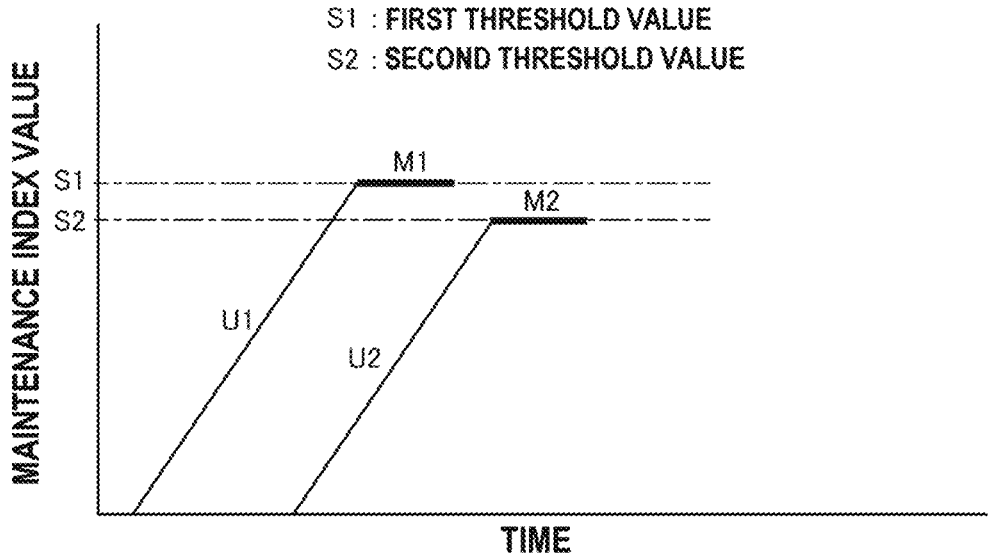

The operation controller 15 predicts the maintenance time of the first processing unit 101 and the maintenance time of the second processing unit 102 based on the first maintenance index value and the second maintenance index value. FIG. 15 is a graph showing changes in the first maintenance index value and the second maintenance index value over time. In FIG. 15, vertical axis represents the first maintenance index value and the second maintenance index value, and horizontal axis represents time.

As shown in FIG. 15, the first maintenance index value and the second maintenance index value approach a first threshold value and a second threshold value, respectively, over time. A point in time at which the first maintenance index value reaches the first threshold is an expected arrival point in time of the maintenance time M1 of the first processing unit 101, and a point in time at which the second maintenance index value reaches the second threshold is an expected arrival point in time of the maintenance time M2 of the second processing unit 102. In the example shown in FIG. 15, the first maintenance index value and the second maintenance index value change linearly, but they may change in a curved line, or in a combination of straight line and curved line. Furthermore, in the example shown in FIG. 15, the first maintenance index value and the second maintenance index value increase with time, while depending on the calculation method for the first maintenance index value and the second maintenance index value, the first maintenance index value and the second maintenance index value may decrease over time. In either case, the first maintenance index value and the second maintenance index value change over time.

In the example shown in FIG. 15, the maintenance time M1 of the first processing unit 101 and the maintenance time M2 of the second processing unit 102 do not overlap. Therefore, during the maintenance work on the first processing unit 101, the second processing unit 102 can continue processing substrates, and during the maintenance work on the second processing unit 102, the first processing unit 101 can continue processing substrates.

Figure 16:
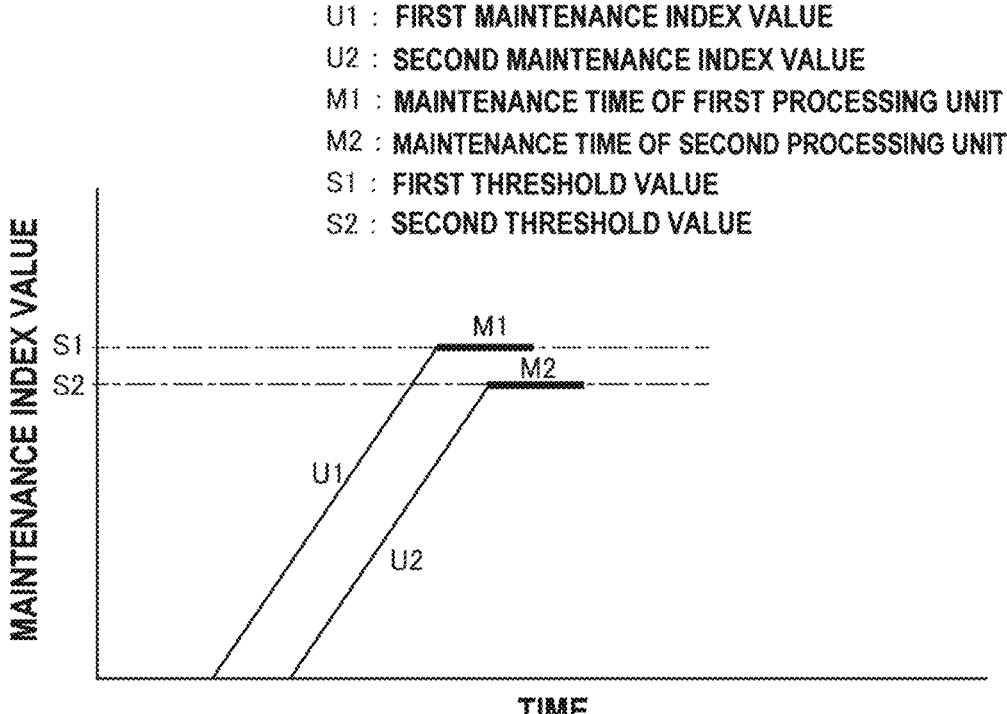
FIG. 16 is a graph showing an example in which maintenance times of the first processing unit and the second processing unit overlap.

In an example shown in FIG. 16, the predicted maintenance time M1 of the first processing unit 101 overlaps with the predicted maintenance time M2 of the second processing unit 102. In such a case, the operations of both the first processing unit 101 and the second processing unit 102 must be stopped for the maintenance. During that time, the substrate processing apparatus cannot process a substrate, and a throughput is lowered.

Therefore, in one embodiment, if the predicted maintenance time M1 of the first processing unit 101 overlaps with the predicted maintenance time M2 of the second processing unit 102, the operation controller 15 changes the operating rate of at least one of the first processing unit 101 and the second processing unit 102 such that the predicted maintenance time M1 of the first processing unit 101 does not overlap with the predicted maintenance time M2 of the second processing unit 102.

A length of the maintenance time M1 of the first processing unit 101 and a length of the maintenance time M2 of the second processing unit 102 are determined in advance based on a time required to replace the consumable with new one, and an operating time required for break-in of the new consumable. Furthermore, if necessary, the lengths of the maintenance times M1 and M2 may be determined by further adding a time required for checking a quality of the apparatus after replacement of the consumable. Although the time required for actual maintenance varies depending on consumable, the lengths of maintenance times M1 and M2 used in the operation controller 15 to predict the maintenance times M1 and M2 are fixed lengths that have been determined in advance. In one embodiment, the lengths of the maintenance times M1 and M2 may be fixed lengths that are predetermined for each type of consumable. Therefore, the length of the maintenance time M1 may be different from the length of the maintenance time M2.

Figure 17:
FIG. 17 is a graph illustrating an embodiment of avoiding the overlapping of the maintenance times by increasing an operating rate of the first processing unit.
Figure 17:
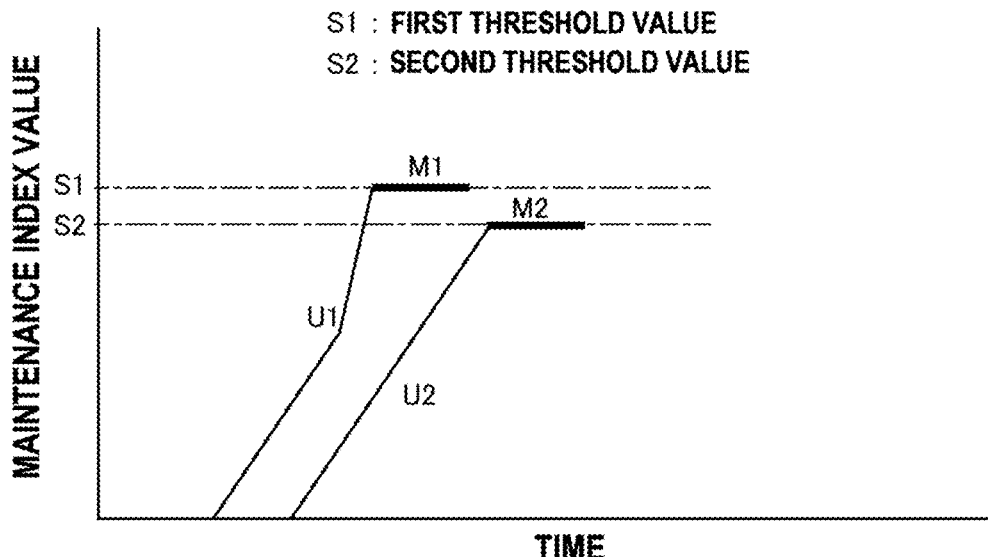

When the maintenance time M1 of the first processing unit 101 is expected to be reached earlier than the maintenance time M2 of the second processing unit 102, the operation controller 15 increases the operating rate of the first processing unit 101 as shown in FIG. 17. Changing the operating rate in this way can prevent the maintenance time M1 of the first processing unit 101 from overlapping with the maintenance time M2 of the second processing unit 102.

Figure 18:
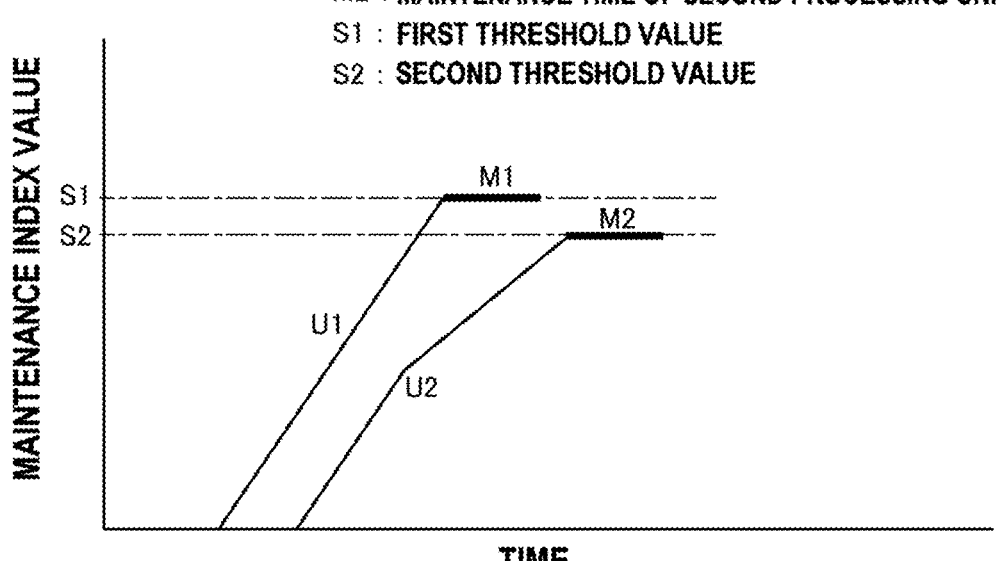
FIG. 18 is a graph showing an embodiment of avoiding the overlapping of the maintenance times by reducing an operating rate of the second processing unit.
Figure 19:
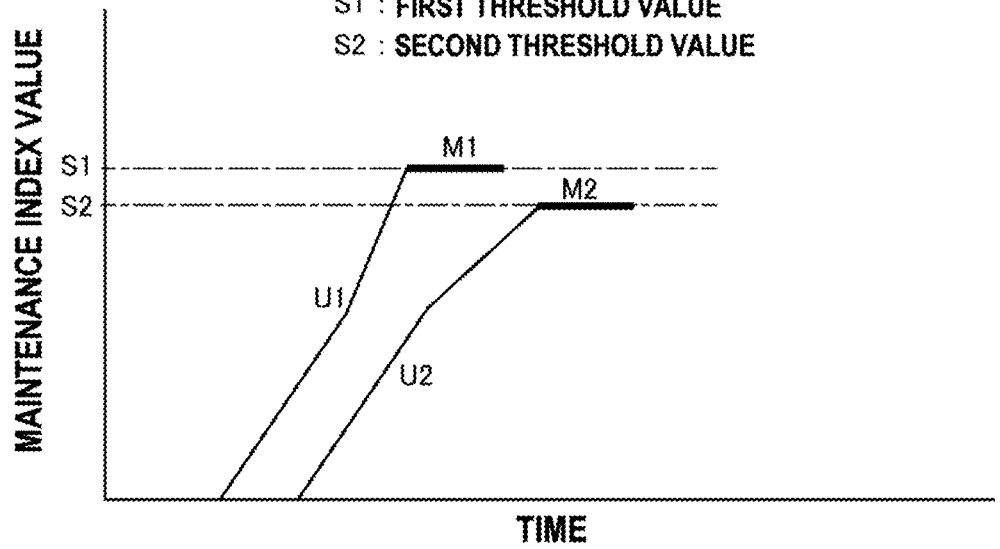
FIG. 19 is a graph showing an embodiment of avoiding the overlapping of the maintenance times by increasing the operating rate of the first processing unit and reducing the operating rate of the second processing unit.

In another embodiment, as shown in FIG. 18, the operation controller 15 may lower the operating rate of the second processing unit 102 such that the maintenance time M1 of the first processing unit 101 does not overlap with the maintenance time M2 of the second processing unit 102. Alternatively, as shown in FIG. 19, the operation controller 15 may increase the operating rate of the first processing unit 101 and lower the operating rate of the second processing unit 102 such that the maintenance time M1 of the first processing unit 101 does not overlap with the maintenance time M2 of the second processing unit 102. In this case, a timing of increasing the operating rate of the first processing unit 101 and a timing of lowering the operating rate of the second processing unit 102 may be different.

If the maintenance time M2 of the second processing unit 102 is expected to be reached earlier than the maintenance time M1 of the first processing unit 101, the operation controller 15 increases the operating rate of the second processing unit 102, or lowers the operating rate of the first processing unit 101, or increases the operating rate of the second processing unit 102 and lowers the operating rate of the first processing unit 101. Changing the operating rate in this way can prevent the maintenance time M1 of the first processing unit 101 from overlapping with the maintenance time M2 of the second processing unit 102.

Figure 20:
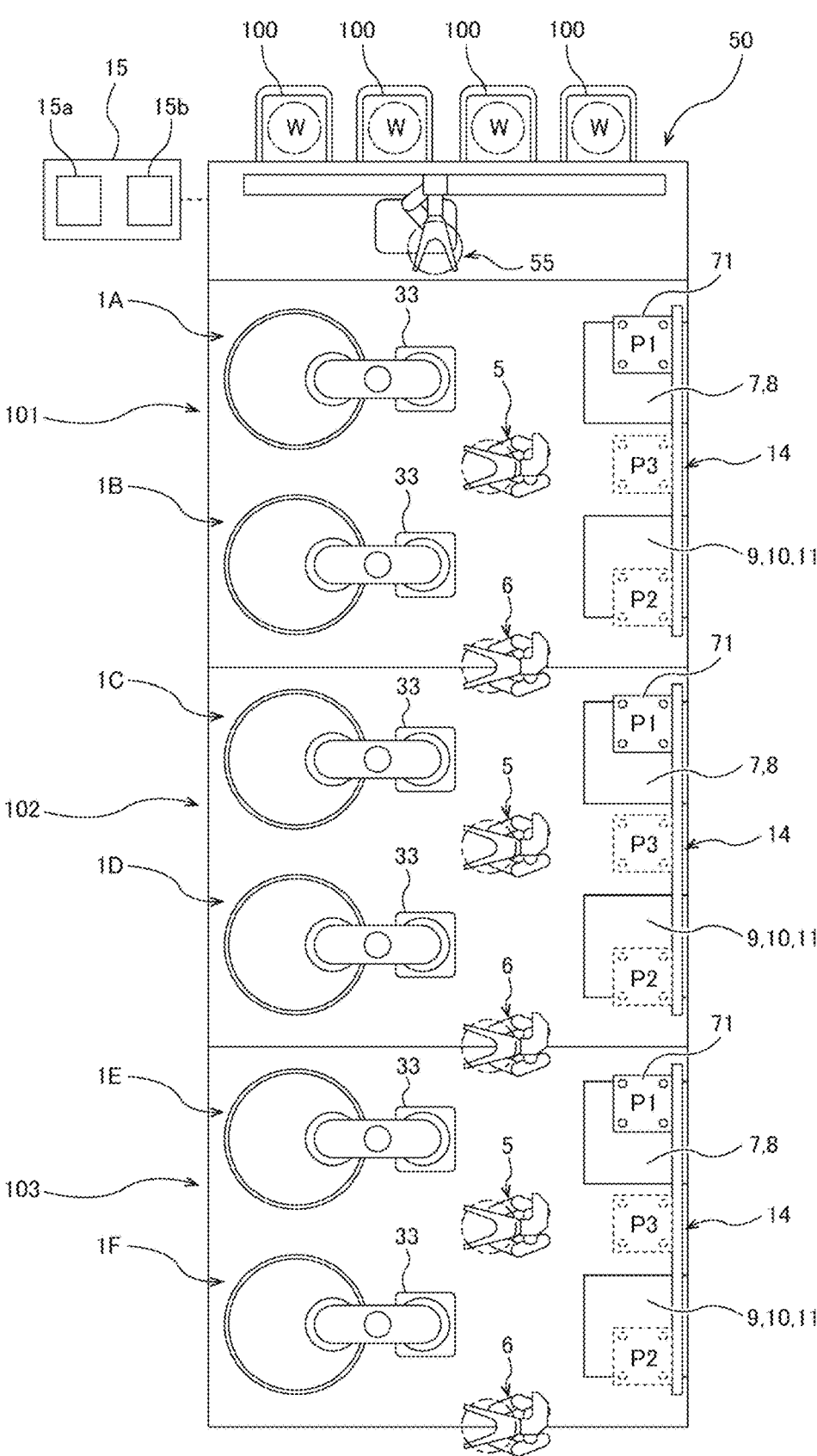
FIG. 20 is a plan view showing another embodiment of the substrate processing apparatus.

FIG. 20 is a plan view showing another embodiment of the substrate processing apparatus. Configurations and operations of this embodiment, which will not be specifically described, are the same as those of the embodiments described with reference to FIGS. 1 to 14, and therefore repetitive descriptions will be omitted. The substrate processing apparatus of the embodiment shown in FIG. 20 further includes a third processing unit 103 in addition to the first processing unit 101 and the second processing unit 102. The third processing unit 103 is coupled to the second processing unit 102. The first processing unit 101, the second processing unit 102, and the third processing unit 103 are arranged in series. The third processing unit 103 has the same components as the first processing unit 101 and the second processing unit 102. In FIG. 20, the wall 16 and the elevating transportation area 17 described with reference to FIG. 3 are omitted from illustration.

Each of the first processing unit 101, the second processing unit 102, and the third processing unit 103 is a unitized assembly. In one embodiment, the third processing unit 103 is removably coupled to the second processing unit 102 such that the entirety of the third processing unit 103 is separable from the second processing unit 102. Furthermore, it is also possible to couple one or more additional processing units with a similar configuration to the third processing unit 103. Specifically, four or more processing units including the first processing unit 101, the second processing unit 102, and the third processing unit 103 may be coupled in series. Operations of a plurality of processing units including at least the first processing unit 101, the second processing unit 102, and the third processing unit 103 are controlled by the operation controller 15.

Although duplicate explanations will be omitted, the substrate processing apparatus of the embodiment shown in FIG. 20 can process multiple substrates in the first processing unit 101 and the second processing unit 102, as described with reference to FIGS. 12 and 13. The substrate processing apparatus of the embodiment shown in FIG. 20 can also transport a substrate in the rescue transportation route described with reference to FIG. 14. Furthermore, as shown in FIG. 21, the substrate processing apparatus can process (polish, clean, dry) a substrate in the third processing unit 103.

Figure 21:
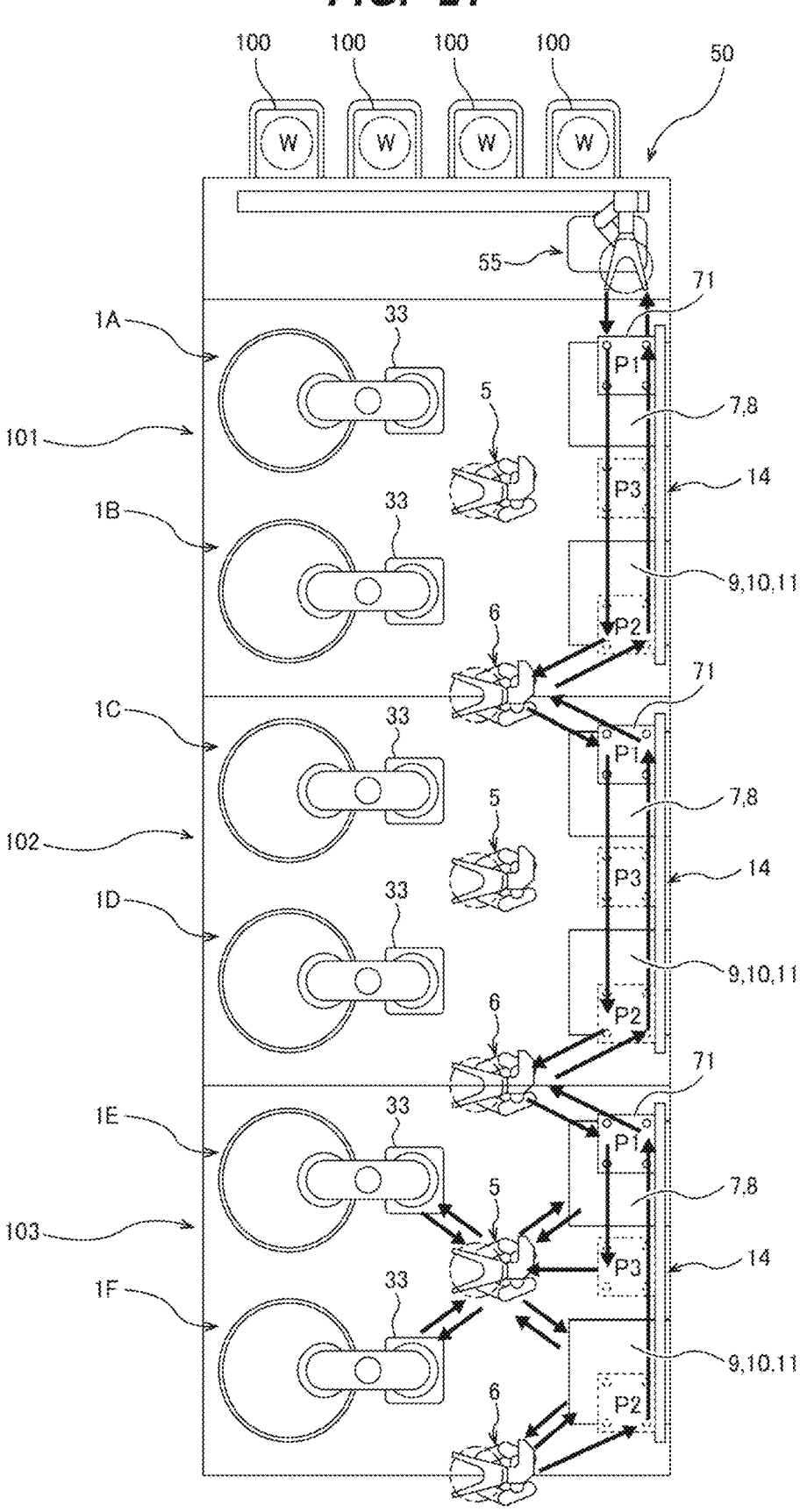
FIG. 21 is a diagram showing an example of a substrate transportation route and a processing sequence.

In the example shown in FIG. 21, the substrate W is transported from the cassette storage 100 to the first position P1 of the substrate transporter 14 of the first processing unit 101 by the transfer robot 55. The substrate W is transported from the first position P1 to the second position P2 by the substrate transporter 14. The substrate W is transported from the second position P2 of the substrate transporter 14 of the first processing unit 101 to the first position P1 of the substrate transporter 14 of the second processing unit 102 by the relay transporter 6 of the first processing unit 101. The substrate W is transported from the first position P1 to the second position P2 by the substrate transporter 14 of the second processing unit 102. Further, the substrate W is transported from the second position P2 of the substrate transporter 14 of the second processing unit 102 to the first position P1 of the substrate transporter 14 of the third processing unit 103 by the relay transporter 6 of the second processing unit 102. The substrate transporter 14 of the third processing unit 103 transports the substrate W from the first position P1 to the third position P3.

In the third processing unit 103, the substrate W is transported in the order of the cleaning module (pre-cleaning module) 7, the polishing module 1E, the polishing module 1F, and the cleaning modules 8, 9, and 10 by the elevating transporter 5. Further, the substrate W is transported in the order of the drying module 11 and the second position P2 of the substrate transporter 14 by the relay transporter 6.

In one embodiment, the substrate W may be polished by only one of the two polishing modules 1E, 1F. In one embodiment, the cleaning module 7 may be used as the post-cleaning module rather than the pre-cleaning module. In one embodiment, at least one of the four cleaning modules 7, 8, 9, 10 may be used as the post-cleaning module.

The substrate W that has been processed (polished, cleaned, dried) by the third processing unit 103 is transported from the second position P2 to the first position P1 by the substrate transporter 14 of the third processing unit 103, and is then transported to the second position P2 of the substrate transporter 14 of the second processing unit 102 by the relay transporter 6 of the second processing unit 102. The substrate W is transported from the second position P2 to the first position P1 by the substrate transporter 14 of the second processing unit 102, and then transported to the second position P2 of the substrate transporter 14 of the first processing unit 101 by the relay transporter 6 of the first processing unit 101. The substrate W is transported from the second position P2 to the first position P1 by the substrate transporter 14 of the first processing unit 101, and is returned to the cassette storage 100 by the transfer robot 55.

Figure 22:
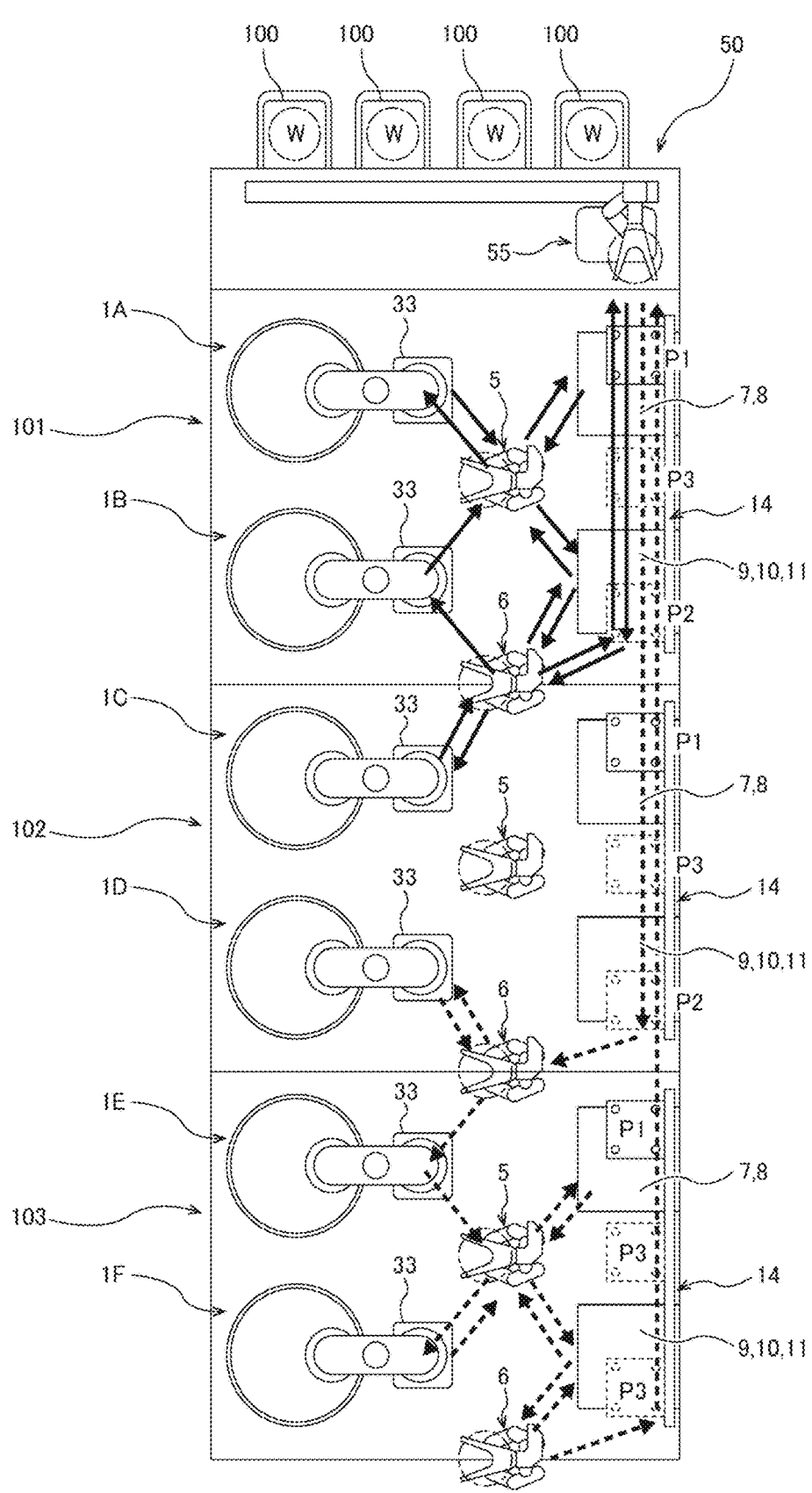
FIG. 22 is a diagram showing another example of the substrate transportation route and the processing sequence.

FIG. 22 is a diagram illustrating another example of a substrate transportation route and a processing sequence. Detailed operations not particularly described are the same as those in the embodiments described above. A first substrate is transported to the second position P2 by the substrate transporter 14 of the first processing unit 101. As shown by solid arrow, the first substrate is transported from the second position P2 to the polishing module 1C by the relay transporter 6 of the first processing unit 101, and transported from the polishing module 1C to the polishing module 1B by the relay transporter 6 of the first processing unit 101. The first substrate is then transported from the polishing module 1B to the polishing module 1A by the elevating transporter 5 of the first processing unit 101. Three-stage polishing of the first substrate is performed by the polishing modules 1C, 1B, and 1A.

The polished first substrate is transported to the cleaning modules 8, 9, and 10 and the drying module 11 of the first processing unit 101, where the polished first substrate is cleaned and dried. The processed first substrate is then transported to the first position P1 of the first processing unit 101 by the relay transporter 6 and the substrate transporter 14 of the first processing unit 101, and returned to the cassette storage 100 by the transfer robot 55.

A second substrate is transported to the second position P2 of the second processing unit 102 by the substrate transporter 14 and the relay transporter 6 of the first processing unit 101, and the substrate transporter 14 of the second processing unit 102. As shown by dotted arrow, the second substrate is transported from the second position P2 of the second processing unit 102 to the polishing module 1D by the relay transporter 6 of the second processing unit 102, and then transported from the polishing module 1D to the polishing module 1E by the relay transporter 6 of the second processing unit 102. The second substrate is then transported from the polishing module 1E to the polishing module 1F by the elevating transporter 5 of the third processing unit 103. Three-stage polishing of the second substrate is performed by the polishing modules 1D, 1E, and 1F.

The polished second substrate is transported to the cleaning modules 8, 9, 10 and the drying module 11 of the third processing unit 103, where the polished second substrate is cleaned and dried. The processed second substrate is then transported to the first position P1 of the first processing unit 101 by the relay transporter 6 and the substrate transporter 14 of the third processing unit 103, the relay transporter 6 and the substrate transporter 14 of the second processing unit 102, and the relay transporter 6 and the substrate transporter 14 of the first processing unit 101. The processed second substrate is then returned to the cassette storage 100 by the transfer robot 55.

As shown in FIG. 22, the substrate processing apparatus including the three processing units 101, 102, and 103 can process a plurality of substrates in parallel.

The processing units 101, 102, 103 may be inseparable from each other. Multiple processing units can be combined depending on a required substrate processing sequence and processing amount. The cleaning process can be started in substantially the same time after polishing of the substrate no matter which processing unit is used. Therefore, it is possible to reduce a difference in substrate corrosion between substrates.

In another embodiment, a different processing unit having a different processing module may be provided in addition to the first processing unit 101 and the second processing unit 102. This additional processing unit may be coupled to an opposite side of the second processing unit 102 from the first processing unit 101. Examples of the different processing module include a bevel polishing device configured to polish a bevel portion of a substrate, and a partial correction polishing device configured to preferentially polish only a portion of a substrate surface to improve a uniformity of a substrate thickness. Even if the processing module having different function is added in this manner, the substrate processing apparatus can be made multifunctional without significantly changing the configurations of the first processing module 101 and the second processing module 102.

The embodiments described with reference to FIGS. 15 to 19 for avoiding overlapping of the maintenance times can be applied to the embodiments described with reference to FIGS. 20 to 22. Specifically, the operation controller 15 calculates a first maintenance index value related to maintenance of a consumable in the first processing unit 101, a second maintenance index value related to maintenance of a consumable in the second processing unit 102, and a third maintenance index value related to maintenance of a consumable in the second processing unit 102. The operation controller 15 predicts a maintenance time of the first processing unit 101, a maintenance time of the second processing unit 102, and a maintenance time of the third processing unit 103 based on the first maintenance index value, the second maintenance index value, and the third maintenance index value. When the predicted maintenance times of any two of the first processing unit 101, the second processing unit 102, and the third processing unit 103 overlap, the operation controller 15 changes an operating rate of at least one of the two processing units such that the predicted maintenance times of the two processing units do not overlap.

When the maintenance time of one of the two processing units is expected to be reached before the maintenance time of other of the two processing units, the operation controller 15 increases the operating rate of the one of the two processing units, or lowers the operating rate of the other of the two processing units, or increases the operating rate of the one of the two processing units and lowers the operating rate of the other of the two processing units.

For example, when the maintenance time of the second processing unit 102 is expected to be reached before the maintenance time of the third processing unit 103, the operation controller 15 increases the operating rate of the second processing unit 102, or lowers the operating rate of the third processing unit 103, or increases the operating rate of the second processing unit 102 and lowers the operating rate of the third processing unit 103. When the maintenance time of the first processing unit 101 is expected to overlap with the maintenance time of the third processing unit 103, the operation controller 15 changes the operating rate of at least one of the first processing unit 101 and the third processing unit 103 in the same way, so that the maintenance times of the first processing unit 101 and the third processing unit 103 do not overlap.

Changing the operating rate in this way enables two of the three processing units 101, 102, 103 to continue processing substrates while maintenance is being performed on other one of the three processing units 101, 102, 103. As a result, the throughput of the substrate processing apparatus can be maintained.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus comprising:

a first processing unit and a second processing unit each configured to process a substrate, each of the first processing unit and the second processing unit including:

a polishing module configured to polish the substrate;

a cleaning module configured to clean the substrate;

a drying module configured to dry the cleaned substrate;

a substrate transporter extending from one side to opposite side of each processing unit;

an elevating transporter configured to transport the substrate from the substrate transporter to the polishing module and from the polishing module to the cleaning module; and a relay transporter configured to transport the substrate, the relay transporter of the first processing unit being configured to transport the substrate between the first processing unit and the second processing unit.

2. The substrate processing apparatus according to claim 1, wherein the polishing module and the cleaning module are partitioned by an elevating transportation area in which the elevating transporter is disposed.

3. The substrate processing apparatus according to claim 1, wherein the relay transporter of the first processing unit is arranged between the first processing unit and the second processing unit.

4. The substrate processing apparatus according to claim 1, wherein the substrate transporter includes a substrate stage configured to be stopped at a first position, a second position, and a third position, and the third position is located between the first position and the second position, and the elevating transporter is configured to be able to access the substrate stage at the third position.

5. The substrate processing apparatus according to claim 4, wherein the second position of the substrate transporter of the first processing unit is adjacent to the first position of the substrate transporter of the second processing unit, and the relay transporter of the first processing unit is configured to be able to access both the second position of the substrate transporter of the first processing unit and the first position of the substrate transporter of the second processing unit.

6. The substrate processing apparatus according to claim 1, wherein the elevating transporter and the relay transporter of the first processing unit, and the elevating transporter and the relay transporter of the second processing unit are arranged alternately at equal intervals.

7. The substrate processing apparatus according to claim 6, wherein each of the first processing unit and the second processing unit includes a plurality of polishing modules, and the plurality of polishing modules of the first processing unit and the plurality of polishing modules of the second processing unit are arranged at equal intervals.

8. The substrate processing apparatus according to claim 7, wherein arrangement intervals of the elevating transporter and the relay transporter of the first processing unit and the elevating transporter and the relay transporter of the second processing unit are the same as arrangement intervals of the plurality of polishing modules of the first processing unit and the plurality of polishing modules of the second processing unit.

9. The substrate processing apparatus according to claim 1, wherein the elevating transporter is configured to transport the substrate to the cleaning unit before transporting the substrate to the polishing module.

10. The substrate processing apparatus according to claim 1, wherein the relay transporter is configured to transport the substrate from the cleaning module to the drying module.

11. The substrate processing according to claim 1, wherein the relay transporter of the first processing unit is configured to be able to access both the polishing module of the first processing unit and the polishing module of the second processing unit.

12. The substrate processing apparatus according to claim 11, wherein a distance from the relay transporter of the first processing unit to the polishing module of the first processing unit is the same as a distance from the relay transporter of the first processing unit to the polishing module of the second processing unit.

13. The substrate processing according to claim 1, wherein the relay transporter of the first processing unit is configured to be able to access both the cleaning module of the first processing unit and the cleaning module of the second processing unit.

14. The substrate processing apparatus according to claim 13, wherein a distance from the relay transporter of the first processing unit to the cleaning module of the first processing unit is the same as a distance from the relay transporter of the first processing unit to the cleaning module of the second processing unit.

15. The substrate processing apparatus according to claim 1, further comprising an operation controller configured to control operations of the first processing unit and the second processing unit, the operation controller being configured to:

calculate a first maintenance index value related to maintenance of a consumable in the first processing unit and a second maintenance index value related to maintenance of a consumable in the second processing unit;

predict a maintenance time of the first processing unit and a maintenance time of the second processing unit based on the first maintenance index value and the second maintenance index value; and when the predicted maintenance time of the first processing unit overlaps with the predicted maintenance time of the second processing unit, change an operating rate of at least one of the first processing unit and the second processing unit such that the predicted maintenance time of the first processing unit does not overlap with the predicted maintenance time of the second processing unit.

16. The substrate processing apparatus according to claim 15, wherein the operation controller is configured to increase the operating rate of the first processing unit, or lower the operating rate of the second processing unit, or increase the operating rate of the first processing unit and lower the operating rate of the second processing unit when the maintenance time of the first processing unit is expected to be reached before the maintenance time of the second processing unit.

17. The substrate processing apparatus according to claim 15, wherein the operation controller is configured to increase the operating rate of the second processing unit, or lower the operating rate of the first processing unit, or increase the operating rate of the second processing unit and lower the operating rate of the first processing unit when the maintenance time of the second processing unit is expected to be reached before the maintenance time of the first processing unit.

18. A substrate processing apparatus comprising:

a first processing unit, a second processing unit, and a third processing unit each configured to process a substrate, each of the first processing unit, the second processing unit, and the third processing unit including:

a plurality of polishing modules each configured to polish the substrate;

a cleaning module configured to clean the substrate;

a drying module configured to dry the cleaned substrate;

a substrate transporter extending from one side to opposite side of each processing unit;

an elevating transporter configured to transport the substrate from the substrate transporter to one of the plurality of polishing modules and from the one of the plurality of polishing modules to the cleaning module; and a relay transporter configured to transport the substrate, the relay transporter of the first processing unit being configured to transport the substrate between the first processing unit and the second processing unit, the relay transporter of the second processing unit being configured to transport the substrate between the second processing unit and the third processing unit.

19. The substrate processing apparatus according to claim 18, wherein the plurality of polishing modules of the first processing unit, the plurality of polishing modules of the second processing unit, and the plurality of polishing modules of the third processing unit are configured to perform three-stage polishing of a plurality of substrates in parallel.

20. The substrate processing apparatus according to claim 18, further comprising an operation controller configured to control operations of the first processing unit, the second processing unit, and the third processing unit, the operation controller being configured to:

calculate a first maintenance index value related to maintenance of a consumable in the first processing unit, a second maintenance index value related to maintenance of a consumable in the second processing unit, and a third maintenance index value related to maintenance of a consumable in the third processing unit;

predict a maintenance time of the first processing unit, a maintenance time of the second processing unit, and a maintenance time of the third processing unit based on the first maintenance index value, the second maintenance index value, and the third maintenance index value; and when predicted maintenance times of any two of the first processing unit, the second processing unit, and the third processing unit overlap, change an operating rate of at least one of the two processing units such that the predicted maintenance times of the two processing units do not overlap.

21. The substrate processing apparatus according to claim 20, wherein the operation controller is configured to increase the operating rate of one of the two processing units, or lower the operating rate of other of the two processing units, or increase the operating rate of the one of the two processing units and lower the operating rate of the other of the two processing units when the maintenance time of the one of the two processing units is expected to be reached before the maintenance time of the other of the two processing units.

* * * * *